(12) United States Patent
Kurita et al.

(10) Patent No.: US 6,404,052 B1
(45) Date of Patent: Jun. 11, 2002

(54) MULTI-LAYER FLEXIBLE PRINTED WIRING BOARD

(75) Inventors: Hideyuki Kurita; Masayuki Nakamura, both of Tochigi (JP)

(73) Assignee: Sony Chemicals Corp., Tokyo (JP)

( * ) Notice: Subject to any disclaimer, the term of this patent is extended or adjusted under 35 U.S.C. 154(b) by 0 days.

(21) Appl. No.: 09/610,674

(22) Filed: Jul. 7, 2000

(30) Foreign Application Priority Data

Jul. 12, 1999 (JP) .......................................... 11-196859

(51) Int. Cl.⁷ .............................................. H01L 23/48
(52) U.S. Cl. ...................... 257/737; 257/735; 257/778; 257/780; 257/784
(58) Field of Search ................................ 257/735, 737, 257/738, 778, 782, 783, 784, 780

(56) References Cited

U.S. PATENT DOCUMENTS

| | | | | |
|---|---|---|---|---|
| 5,434,452 A | * | 7/1995 | Higgins, III | 257/737 |
| 5,488,542 A | * | 1/1996 | Ito | 257/700 |
| 5,789,271 A | * | 8/1998 | Akram | 438/18 |
| 5,821,626 A | * | 10/1998 | Ouchi et al. | 257/778 |
| 5,877,559 A | * | 3/1999 | Takayama et al. | 257/737 |
| 5,995,379 A | * | 11/1999 | Kyougoku et al. | 257/686 |
| 6,124,634 A | * | 9/2000 | Akram et al. | 257/621 |
| 6,157,084 A | * | 12/2000 | Hino et al. | 257/778 |
| 6,211,576 B1 | * | 4/2001 | Shimizu et al. | 257/737 |
| 6,242,103 B1 | * | 6/2001 | Parnworth et al. | 428/458 |

* cited by examiner

Primary Examiner—Cathy Lam
(74) Attorney, Agent, or Firm—Oliff & Berridge, PLC

(57) ABSTRACT

A multi-layer substrate whose thickness is not increased even if a semiconductor package is mounted, having a semiconductor device buried inside and a shield section capable of being connected to a ground potential to prevent noise from penetrating into the semiconductor device, whose thickness is not increased even if a semiconductor package is mounted.

24 Claims, 21 Drawing Sheets

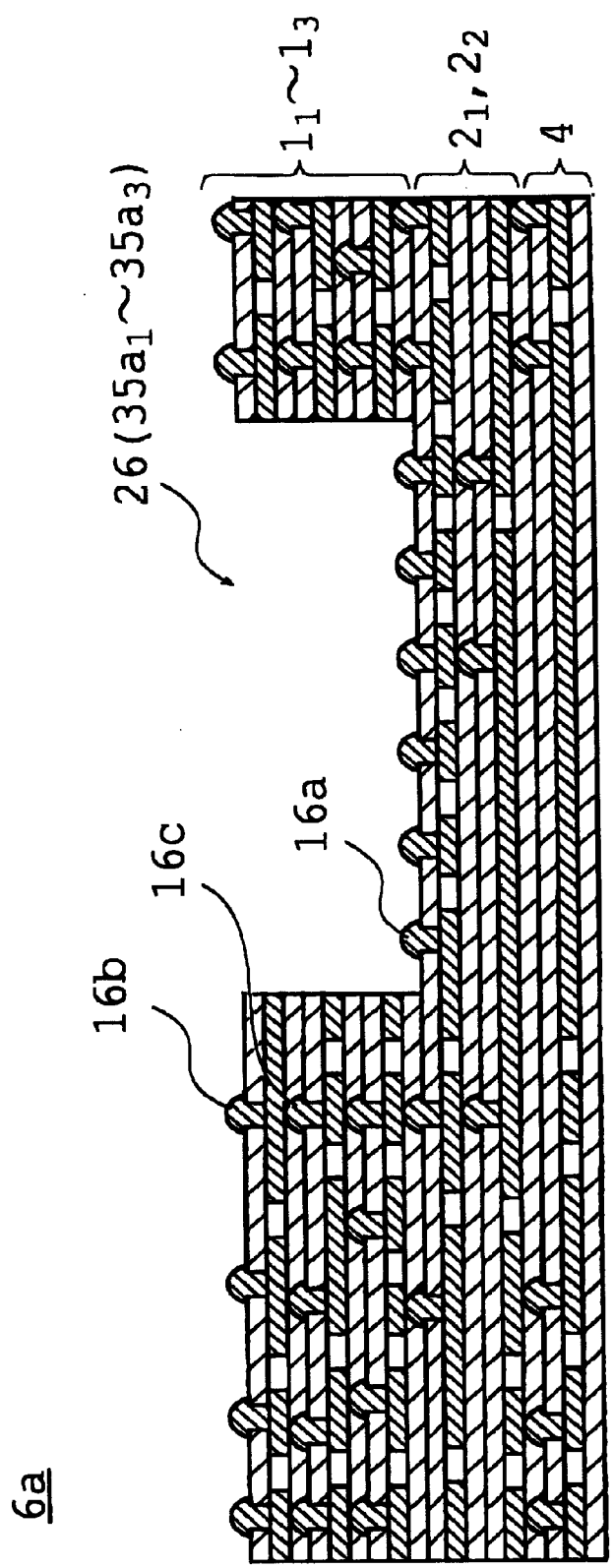

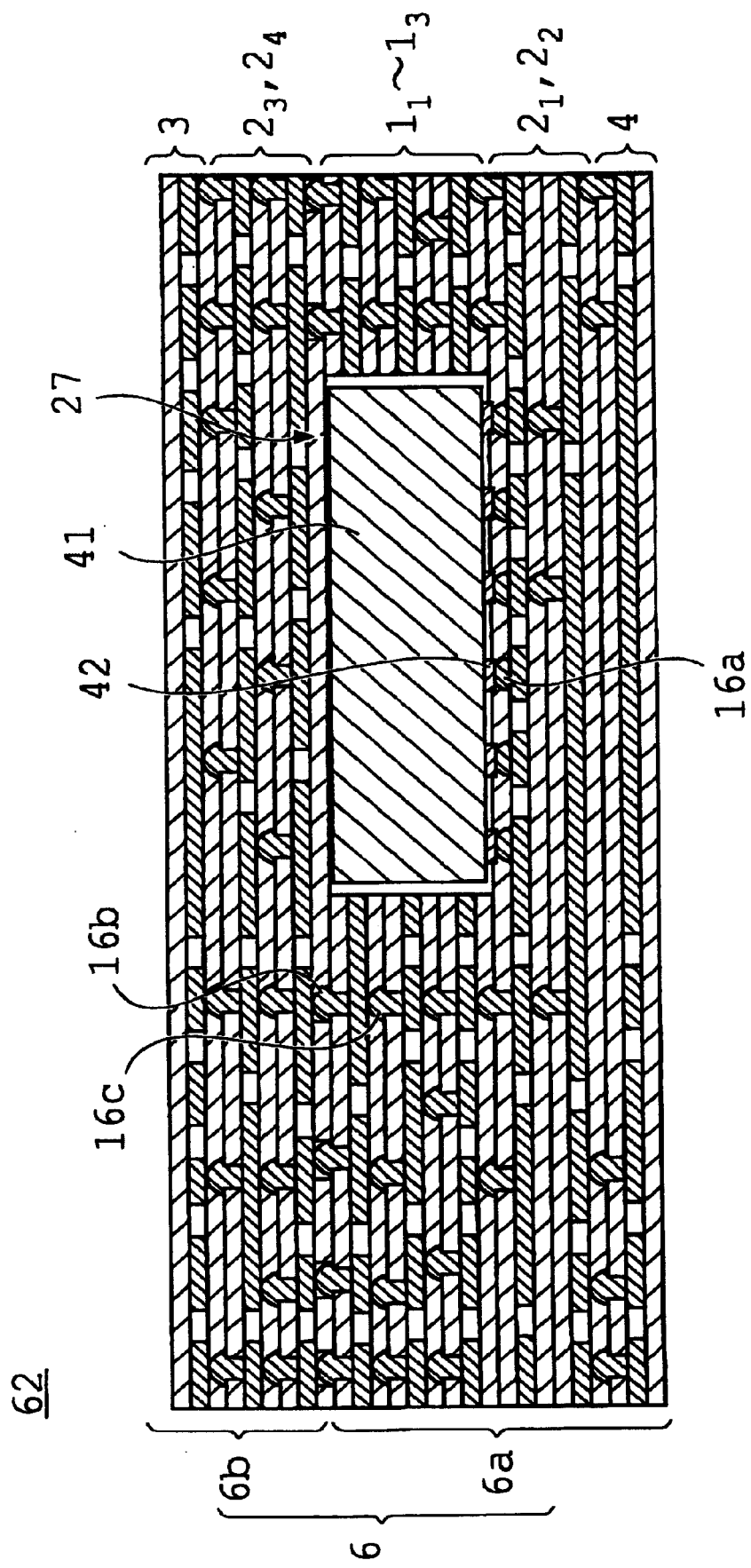

MULTI-LAYER FLEXIBLE PRINTED WIRING BOARD

BACKGROUND OF THE INVENTION

1. Technical Field

The present invention relates to multi-layer substrates, and particularly to multi-layer substrates suitable for mounting of semiconductor devices such as integrated circuits.

2. Related Art

In the related art, multi-layer substrates having high degree of freedom with respect to wiring are used as a substrate for mounting semiconductor devices such as integrated circuits. Reference numeral 106 in FIG. 9A is a multi-layer substrate, and is made up of a plurality of laminated single layer substrates 101.

Each single layer substrate 101 comprises a base film 122 formed of a polyimide film, a wiring film 115 disposed on the base film 122, and an adhesive film 121 arranged on the wiring film 115 and the base film 122. Conductive bumps 116 are formed on the wiring film 115, and the tips of the bumps 116 project from the top of the adhesive film 121. The base film 122 is subjected to patterning a specified locations of a rear surface of the wiring film 115 are partially exposed.

When a plurality of the single layer substrates 101 are laminated on top of one another, bumps 116 of one single layer substrate 101 confront the rear surface of the wiring film 115 of a single layer substrate 101 laminated on top of it, tips of the bumps 116 are brought into contact with the rear surface of the wiring film 115, and they are then stuck together using the adhesive film 121, a multi-layer substrate 106 having a desired number of films is obtained.

The surface of this multi-layer substrate 106 is covered by a protective film 120, and bumps represented by reference numeral 116a project from the surface of the protective film 120.

Reference numeral 133 represents a semiconductor device, and has a plurality of circuits formed insides. This circuit is connected to bonding pads 134 formed on the semiconductor device 133. The bonding pads 134 confront the surface of the multi-layer substrate 106, the bonding pads 134 are made to contact the bumps 116a, as shown in FIG. 9B, thermo-compression bonding is carried out to melt a soldered film of the surface of the bumps 116a, and the circuits inside the semiconductor device 133 are connected to the wiring films 115 inside the multi-layer substrate 106 via the bonding pads 134 and the bumps 116a. When a semiconductor device 133 in chip form is mounted on a multi-layer substrate 106 described above, there is no need to package the semiconductor device 133, contributing significantly to miniaturization of an electronic device.

However, if the semiconductor device 133 is mounted on the multi-layer substrate 106 of the related art described above, the overall thickness of the multi-layer substrate 106 is disadvantageously increased by the thickness of the semiconductor device 133.

Also, with the multi-layer substrate 106 of the related art, since it is necessary to protect the semiconductor device 133, when the semiconductor device 133 is covered with resin 135, as shown in FIG. 9C, the overall thickness is further increased by the thickness of the resin 135.

In recent years, in the field of portable telephones and lap top and palm top personal computers, there has been a demand for further miniaturization and thinning of appliances, which has lead to the demand for multi-layer substrates to be thin even when semiconductor devices are mounted on them.

SUMMARY OF THE INVENTION

The present invention has been conceived in view of the above described problems in the related art, and the object of the present invention is to provide a multi-layer substrate that does not suffer increased thickness, even when semiconductors are mounted.

In order to solve the above described problems, a multi-layer substrate of the present invention comprises a plurality of at least first single layer substrates.

A first single layer substrate used in the present invention has a first resin film, a first wiring film arranged on the first resin film, and through holes passing through from a front surface to a rear surface.

In the present invention, at least two of the first single-layer substrates are electrically connected together, and the through holes are arranged so as to be aligned, forming a housing section.

Generally, the surface area of a semiconductor chip is 1 $mm^2$ or more, which means that it is necessary for the surface area of each of the through holes to also be at least 1 $mm^2$, and the surface area of opening of the housing section formed by laminating the through holes also becomes at least 1 $mm^2$. The depth of the housing section is determined by the number of first single layer substrates laminated on top of one another.

Also, the first single layer substrate of the present invention has first bumps connected to the first wiring film and first connection holes formed on the first resin film, the first wiring film being located on the bottom surface of the first connection holes.

In another aspect of the present invention, of two adjacent first single layer substrates, first bumps of one first single layer substrate are connected to positions of the first wiring film at bottoms of the first connecting holes of the other first single layer substrate.

Accordingly, the multi-layer substrate of the present invention has desired first wiring films within laminated first single layer substrates electrically connected.

In another aspect of the multi-layer substrate of the present invention, a first adhesive film arranged on the first wiring film and exhibiting adhesiveness upon application of heat is provided on the first single layer substrates, and tips of the first bumps project from the surface of the first adhesive surface.

In this case, a plurality of the first single layer substrates are placed in adhered while heating, and the first single layer substrates are stuck together by the resultant adhesive force of the first adhesive layer.

In yet another aspect of the multi-layer substrate of the present invention also has a second single layer substrate.

In a still further aspect, the second single layer substrate comprises a second resin film, and a second wiring film arranged on the second resin film, with no through holes at least at positions where the housing section is formed.

This second single layer substrate is further laminated on the laminated first single layer substrates, and the second single layer substrate is located on the bottom surface of the housing section.

Further, another aspect of the multi-layer substrate of the present invention has the second wiring film of the second single layer substrate electrically connected to at least part of the first wiring film of the first single layer substrate adjacent to the second single layer substrate.

Also, the second single layer substrate of the multi-layer substrate of the present invention has second bumps connected to the second wiring film, the second bumps being connected to the first wiring film located in bottom sections of the first connection holes of the first single layer substrate adjacent to the second single layer substrate.

Also, the second single layer substrate of the multi-layer substrate of the present invention has second connection holes, arranged on the second resin film, the second wiring film being located on a bottom surface of the second connection holes, and first bumps of the first single layer substrate adjacent to the second single layer substrate are connected to positions of the second wiring film at the bottoms of the second connection holes.

A still further aspect of the second single layer substrate of the multi-layer substrate of the present invention has a second adhesive layer, arranged on the second wiring film, exhibiting adhesiveness upon application of heat, and tips of the second bumps project from a surface of the second adhesive film, the second single layer substrate laminated to the first single layer substrate by adhesive force of the second adhesive layer.

The multi-layer substrate of the present invention has the second bumps arranged on a bottom surface of the housing section.

On the other hand, the multi-layer substrate of the present invention has bonding pads formed on the second adhesive layer of the second single layer substrate using openings having the wiring film positioned on a lower surface, and the bonding pads are arranged on the bottom surface of the housing section.

It is possible to arrange one or both of the second bumps and the bonding pads on the bottom surface of the housing section.

With the multi-layer substrate of the present invention, the first bumps of the first single layer substrate are connected to the second wiring film positioned inside the second connection holes of the second single layer substrate, and the first single layer substrate and the second single layer substrate are stuck together using adhesive force of the first adhesive layer. The multi-layer substrate of the present invention has an electrical element disposed inside the housing section formed by the through holes of the laminated first single layer substrates.

The electrical element of the multi-layer substrate of the present invention is electrically connected to the second bumps arranged on the bottom surface of the housing section.

In the case where the electric element is a semiconductor device in a chip state, a metallic wiring film of the semiconductor device is connected to the second bumps.

On the other hand, inside another multi-layer substrate of the present invention, the electrical element Is connected to the bonding pads of the second single layer substrate arranged on the bottom surface of the housing section.

In this case, when the electric elements a semiconductor device in a chip state, bumps of the semiconductor device are connected to the bonding pads.

With the multi-layer substrate of the present invention, the housing section is covered by a covering single layer substrate having at least a resin film.

The multi-layer substrate of the present invention has a wiring film provided on the resin film of the covering single layer substrate. It is possible to laminate the first or second single layer substrates on the covering single layer substrate. It is also possible for the covering single layer substrate to use the second single layer substrate.

The multi-layer substrate of the present invention also has a wiring film of larger surface area than the semiconductor device arranged at positions of the housing section is likely to be elongated will hypothetically be elongated in the laminating direction that is, at positions of the housing section is likely to be elongated will hypothetically be elongated in the laminating direction that is. This large surface area wiring film can be connected to a ground potential and used as a shield layer.

The present invention has the above described structure, and is a multi-layer substrate that can house an electrical element such as s semiconductor integrated circuit inside a housing section formed using a multi-layer substrate, constructed by laminating single layer substrates, and a cavity inside the multi-layer substrate.

The multi-layer substrate of the present invention is formed by laminating a plurality of single layer substrates. For example, it is possible to construct the multi-layer substrate by forming an adhesive layer on respective single layer substrates and causing the adhesive layers to come into contact with resin films to connect each of the single layers to a substrate.

The first and second wiring films of the first and second single layer substrates of the present invention are defined on first and second resin films by patterning copper foil or aluminum foil etc.

It is possible to form first and second bumps on the first and second wiring films. If openings are then formed in the first and second resin films and the first and second wiring films exposed to form connecting sections at bottoms of the resin layers, then when the first single layer substrate and the second single layer substrate are laminated, bumps of one adjacent single layer substrate are aligned with connecting sections of the other adjacent single layer substrate, and tips of the bumps are connected to the wiring film at the bottoms of the connecting sections to electrically connect wiring films of the respective single layer substrates using the bumps.

A solder film is provided on the surface of the bumps, and if the solder is melted while bring the bumps into contact with the wiring film and fixing them together, the bumps are mechanically and electrically connected to the wiring film by the solder which means that the connection between laminated wiring films is reliable.

The first single layer substrates of the present invention have through holes, and if the through holes of a plurality of first single layer substrates are aligned and laminated, the housing section is formed by the aligned through holes. If the second single layer substrate is further laminated on the multi-layer substrate of laminated first single layer substrates, the second single layer substrate is located on the bottom surface of the housing section.

If the second bumps are caused to be exposed at sections of the second single layer substrate at the housing section bottom surface, then when an electrical element such as a semiconductor integrated circuit is housed Inside the housing section of the multi-layer substrate leads leading out from the electrical component and a metallic wiring film formed on the surface of the electrical element can be connected to the bumps.

An anisotropy conductive film is arranged between the bumps and the metallic wiring, and it Is possible to connect between the bumps and the metallic wiring or the leads using the adhesive force and electrical connectivity of the anisotropy conductive film, and it is also possible to connect the metallic wiring of the electrical element and the leads using solder on the surfaces of the bumps.

Further, by causing the second wiring film of the second single layer substrate to be exposed at the housing section bottom surface it is possible to bring the leads and bumps provided on the electrical element into contact with each other and connect them. In this case, it is preferable to form a solder film in advance on the surfaces of the electrical element leads and bumps and connect to the second wiring film using the solder, and it is also possible to use an anisotropy conductive film.

It is also possible to cover the electrical element using a single layer substrate or a multi-layer substrate of laminated single layer substrate, after housing the electrical element in the housing section and electrically connecting to the second wiring film of the second single layer substrate on the housing section bottom surface. The surface of the multi-layer substrate after covering becomes uniform.

The initial depth of the housing section housing the electrical element is shallower than the thickness of the electrical element, and it is also possible to form the housing section in a cover side single layer substrate using a first single layer substrate and to house an upper part of the electrical element inside the cover side housing section. It is possible to electrically connect first wiring films of first single layer substrates forming two housing sections.

If a wiring film having a larger surface area than the electrical element is provided on the multi-layer substrate and this wiring film is connected to a ground potential as a shield section, noise does not penetrate to the electrical element contained inside the housing section of the multi-layer substrate. It is possible to arrange the shield section on both the front and rear surfaces of the electrical element. In the event that the electrical element is a semiconductor integrated circuit, a surface of a semiconductor substrate inside the semiconductor integrated circuit opposite to a surface on which microscopic electrical elements are formed is grounded, so that it is possible to provide a shield section only on the surface where the microscopic electrical elements are formed.

DESCRIPTION OF THE DRAWINGS

FIG. 3B is a cross sectional drawing of a housing section.

FIGS. 4A–4D show a manufacturing process for one example of a multi-layer substrate of the present invention.

DESCRIPTION OF PREFERRED EMBODIMENTS

FIGS. 1A–1M show a manufacturing process for a single layer substrate used in the multi-layer substrate of the present invention.

Figure 1A:
FIGS. 1A–1F show a manufacturing process for a single layer substrate used in the present invention.
Figure 1B:
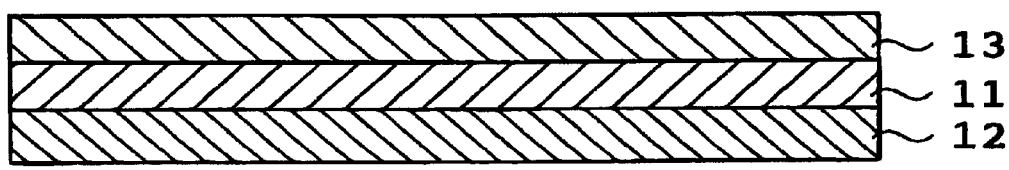

Referring to FIGS. 1A–1F, first of all, a metallic foil 11 (here, rolled copper foil having a thickness of 18 $\mu$m is used) is prepared (FIG. 1A) a protective film 12 is bonded to a rear surface of the metallic foil 11 and a mask film (dry film: SPG-152, manufactured by Asahi Kasei Ltd.) 13 exposable to ultraviolet rays is bonded to the front surface (FIG. 1B).

Figure 1C:
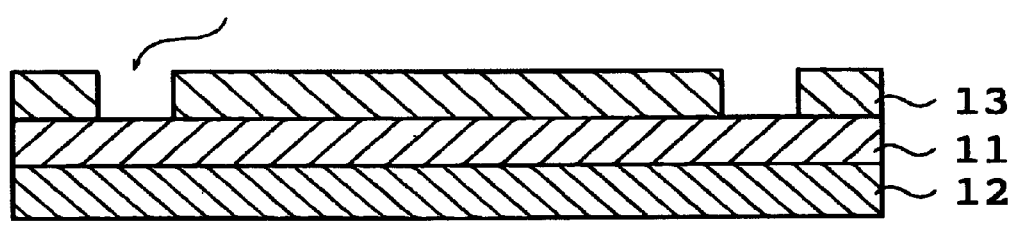

Next, using a glass mask formed into a specified pattern, the mask film 13 is exposed (exposure light strength 100 mJ), and developed with chemicals to form opening sections 14 at specified locations. (FIG. 1C). The formation precision of the opening section 14 at this time is such that the diameter of the opening sections is approximately ±2.5 $\mu$m for a circle whose mask pattern diameter is 30 $\mu$m–50 $\mu$m.

Figure 1D:
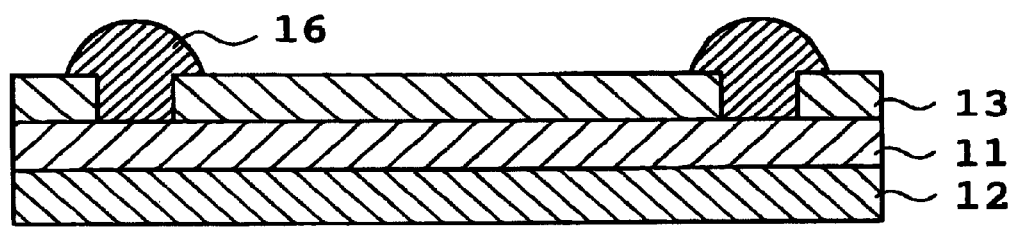

In this state, the entire assembly is submerged in an electrolytic solution for copper plating, and when electric current flows, copper is grown on the surface of the metallic foil 11 that has been exposed at the bottom surface of the opening sections 14, and conductive bumps 16 are formed (FIG. 1D).

Figure 1E:
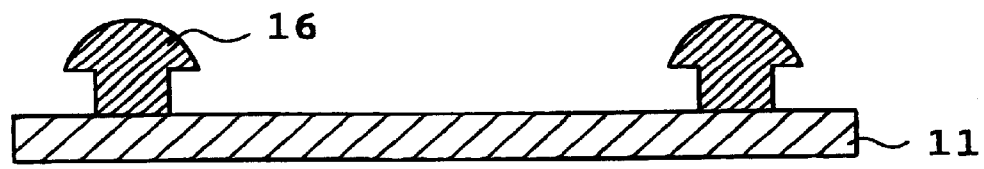

Next, the mask film 13 and the protective film 12 are removed using alkali (FIG. 1E). In this state, mushroom shaped conductive bumps 16 stand in perpendicular direction on the surface of the metallic foil 11.

Figure 1F:
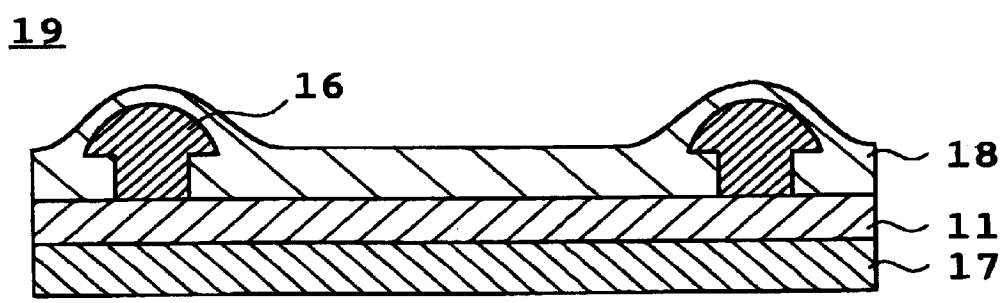
Figure 1G:
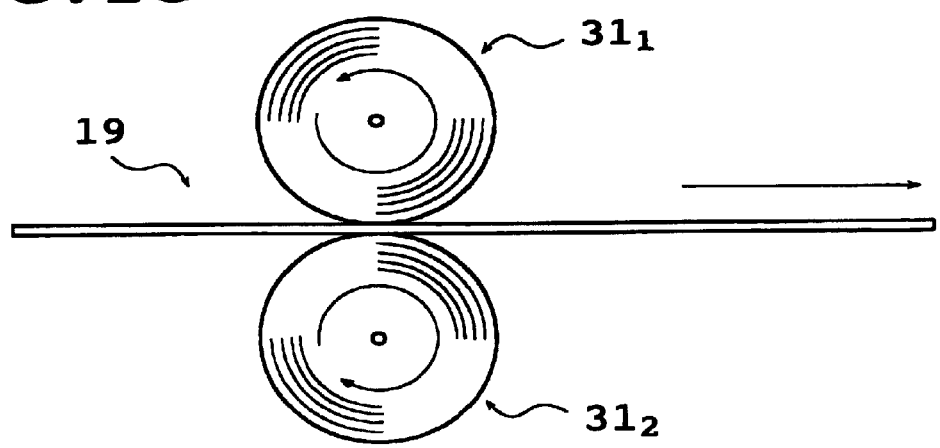
FIGS. 1G–1M shows a continuation of this manufacturing process.

A carrier film 17 is bonded to the rear surface the metallic foils 11 (the surface opposite to the bumps 16), and a resin material formed from a polyimide precursor is applied and dried on the surface of the metallic foil 11 to form a precursor coat 18 comprised of the polyimide precursor (FIG. 1F). In this state, the precursor coat 18 swells out in the vicinity of the bumps 16, but at positions away from the bumps 16 it is uniform. The thickness of the uniform sections of the precursor coat 18 is such that it is thinner than the height of the bumps 16. Reference numeral 19 in FIG. 1F represents a film in the state of having the precursor coat 18 formed.

Figure 1H:
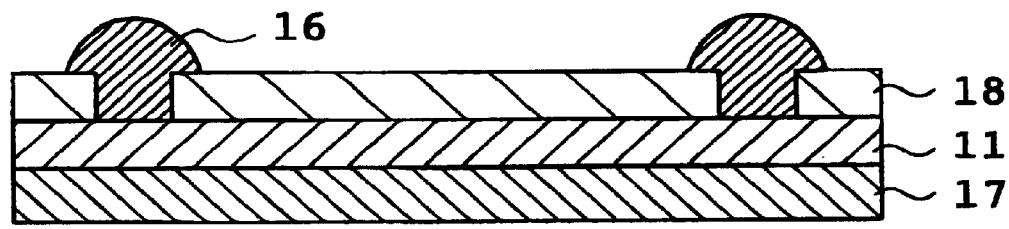

Next, referring to FIG. 1G–FIG. 1J this film 19 is rolled by rollers $31_1$ and $31_2$ (FIG. 1G), to make the precursor coat 18 on the bumps 16 thin. Following that, an alkali solution is sprayed onto the precursor coat 18 and the surface is etched to expose tips of the bumps 16 through the surface of the precursor coat 18 (FIG. 1H).

Figure 1I:
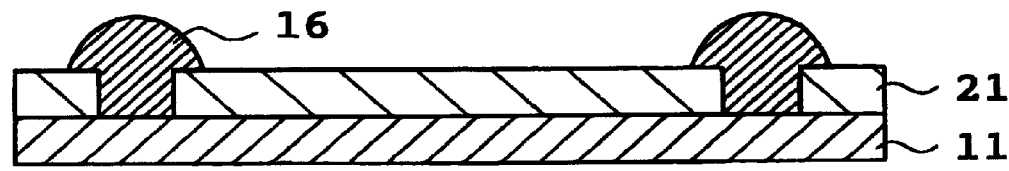

Next, after peeling off the carrier film 17 on the rear surface, the precursor coat 18 is heated (at 280° C. for 10 minutes) to turn it into a film and an adhesive layer 21 formed from polyimide resin is formed on the surface of the metallic foil 11 (FIG. 1I). This adhesive film 21 is thermoplastic, and has zero or negligible adhesive force at normal temperature but exhibits adhesive force when heat is applied.

Figure 1J:
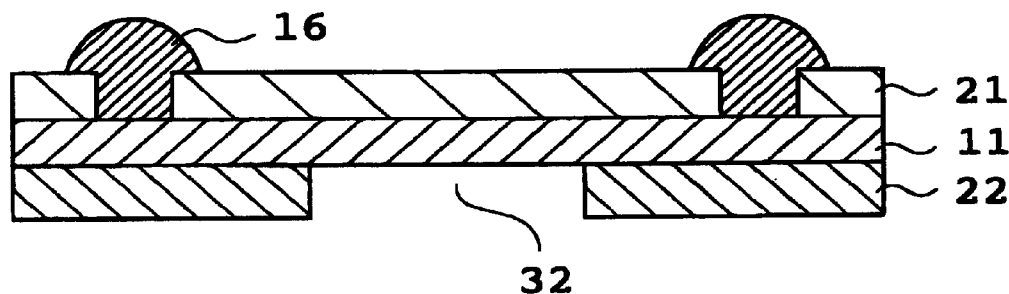

Next, a resist film is formed on the rear surface of the copper foil 11 and subjected to patterning. Reference numeral 22 in FIG. 1J represents a patterned resist film. The metallic film 11 is exposed at the bottom surface of opening sections 32 in this resist film 22, and etching is carried out in this state to transcribe the pattern of the resist film 22 onto the metallic foil and form a wiring film.

Figure 1K:
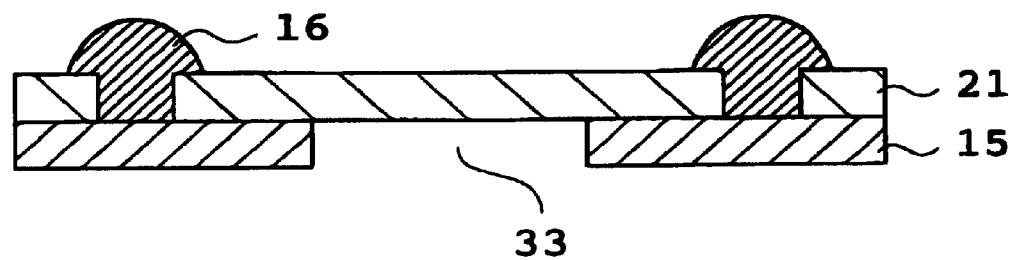

FIG. 1K shows the state with the resist film 22 removed, and reference numeral 15 represents the wiring film that has been subjected to patterning. In the wiring film 15 sections where the bumps 16 are formed are subjected to slightly wide patterning. At this time, a shield section, which will be described later, is formed together with the wiring film 15 by patterning the metallic foil 11.

Reference numeral 33 in FIG. 1K represents parts of a region of removed metallic foil 11 where through holes, that will be described later, will be formed.

Figure 1L:
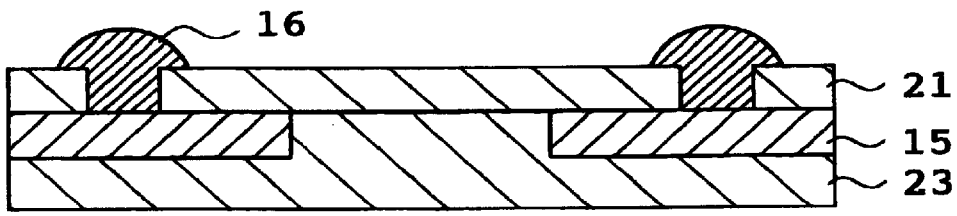

Next, a polyimide precursor is applied on a rear surface side (a surface where the bumps 16 are not formed) of the wiring film 11, and a precursor coat 23 is formed (FIG. 1L). The precursor coat 23 contacts the wiring film 15 at sections where the wiring film 15 exists, and at sections where there is no wiring film 15 the precursor coat 23 contacts the adhesive layer 21.

Figure 1M:
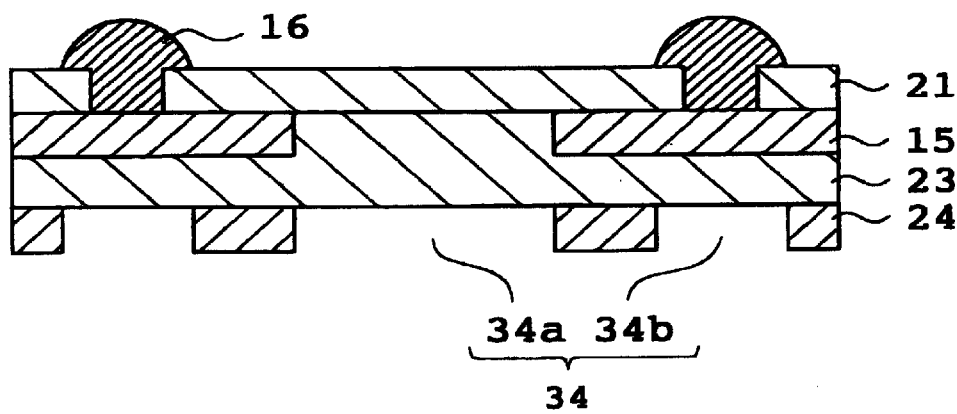

Next, a resist film is formed on the surface of the precursor coat 23 and subjected to patterning. Reference numeral 24 in FIG. 1M represents the resist film 24 that has been subjected to patterning, and defines openings 34. These openings 34 are made up of openings 34a provided at sections where the precursor coat 23 is adhered to the adhesive layer 21, and openings 34b provided at sections where the precursor coat 23 contacts the wiring film 15.

The precursor coat 23 exposed at bottoms of the openings 34a and 34b is removed with the resist film 24 as a mask, and patterning is carried out. At this time, the adhesive layer 21 is also removed together with the precursor coat 23 at sections where the precursor coat 23 adheres the adhesive layer 21.

Figure 1N:
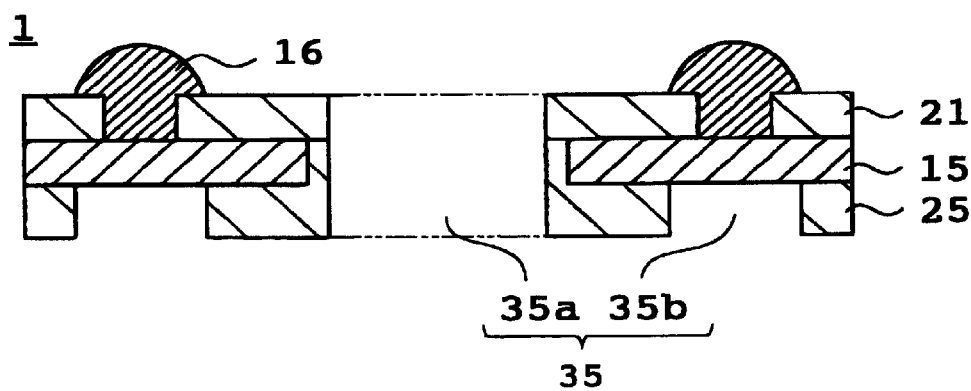
FIG. 1N shows a first single layer substrate.

After the resist film 24 has been removed, heat treatment and hardening of the precursor coat 23 are carried out to obtain a first single layer substrate as shown by reference numeral 1 in FIG. 1N. Reference numeral 25 represents a resin film formed of polyimide film by hardening of the precursor coat 23 that has been subjected to patterning. The resin film 25, the wiring film 15 and the adhesive layer 21 are flexible, which means that the first single layer substrate 1 is also flexible and can be bent.

Openings 35 are partially formed in the resin film 25 and the adhesive layer 21. Among these openings 35, through holes 35a are formed passing through from the front surface of the first single layer substrate 1 to the rear surface at sections where the wiring film 15 is not provided and the adhesive layer 21 and the resin film 25 have both been removed. At sections where there is the wiring film 15, the wiring film 15 and the adhesive layer 21 remain and only the resin film 25 is removed to form openings as connecting holes 35b. These connecting holes 35b do not penetrate through the substrate, and are exposed to the wiring film 15 at the bottom.

The through holes 35a have sections where they form a housing section that will be described later when a plurality of first single layer substrates 1 are laminated, and the size of through holes 35a of the respective laminated first single layer substrates 1 is almost the same size of a chip-mounted semiconductor device. For example, the size of one edge of the through holes 35a is greater than 1 mm and less than a few tens of mm. Inside the through holes 35a an end section of the wiring film 15 is not exposed, and when the chip-state semiconductor device is contained inside the housing section formed by the through holes 35a, the side surfaces of the semiconductor device do not come into contact with the wiring film 15.

On the other hand, the size of the connecting holes 35b is the same as the size of the bumps 16 (50–500 $\mu$m) and tips of the bumps 16 can be brought into contact with the surface of the wiring film 15 exposed at the bottoms of the connecting holes 35b.

Figure 2A:
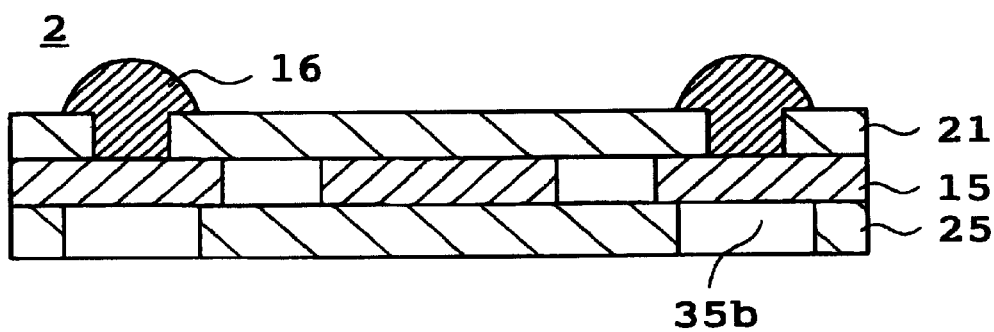
FIG. 2A shows a second single layer substrate.

Reference numeral 2 in FIG. 2A represents a second single layer substrate without through holes 34a. Except that it has no openings 34a of the resist film 24 formed at sections where the adhesive layer 21 and the precursor coat 23 are adhered together, this second single layer substrate 2 is formed using the same processes as the first single layer substrate 1. Accordingly, the second single layer substrate 2 is also flexible, similarly to the first single layer substrate 1.

This second single layer substrate 2 is arranged below the laminated first single layer substrates 1, and constitutes a bottom of the housing section and a cover for the housing section.

Figure 2B:
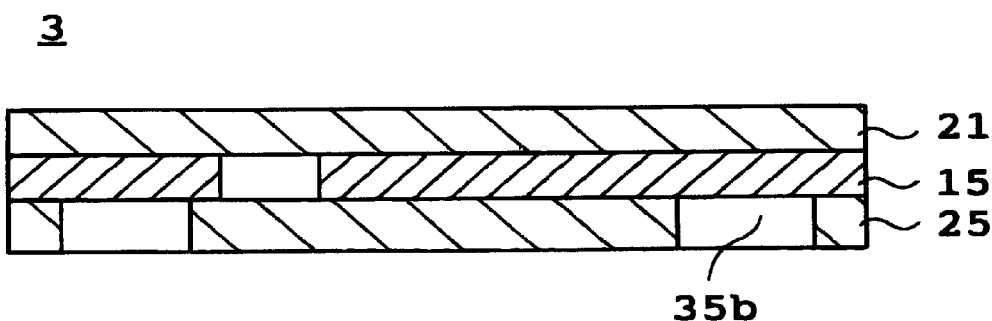
FIG. 2B shows a third single layer substrate.

Reference numeral 3 in FIG. 2B represents a third single layer substrate arranged highest up in a multi-layer substrate when the multi-layer substrate is formed by laminating the single layer substrates. A wiring film 15 of this third single layer substrate 3 is also comprised of copper foil subjected to patterning. A protective film 21 of the same material as the resin film 25 of the first single layer substrate 1 is formed on the surface of the wiring film 15 of the third single layer substrate 3. With the third single layer substrate 3, there are cases where the substrate has bumps 16 and cases where there are no bumps 16. Also, there are cases where through holes 35 are formed and cases where they are not formed.

Figure 2C:
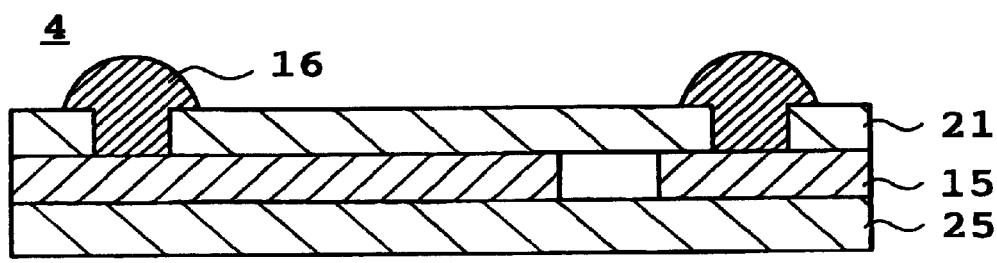
FIG. 2C shows a fourth single layer substrate.

Reference numeral 4 in FIG. 2C represents a fourth single layer substrate arranged at the bottom of the multi-layer substrate. This fourth single layer substrate 4 has the same structure as the second single layer substrate 2 and the wiring film and the resin film use the same material. Accordingly, the fourth single layer substrate 4 is also flexible. With the fourth single layer substrate 4, it is possible to either have connection holes 35b or not have them.

When the multi-layer substrate of the present invention is constructed by laminating the above described first to fourth single layer substrates 1–4, with the single layer substrates laminated on top of one another, positions of the connection holes 35b and the bumps 16 are arranged so that bumps 16 of one single layer substrate come into contact with connection holes 35b of another single layer substrate. By bringing the bumps 16 into contact with the wiring film 15 exposed at the bottom of the connecting holes 35b and crimping them together while heating, the adhesive layer 21 is softened and the adhesive layer 21 exhibits adhesive force to fasten the substrates together.

When a solder coat is formed on the surface of the bumps 16, the wiring film 15 and the bumps 16 are electrically and physically connected by melting the solder. In this case, it is possible to form a gold coating on the surface of the solder coat. The bumps 16 and the wiring film 15 can also be electrically connected without providing the solder coating.

Figure 3A:
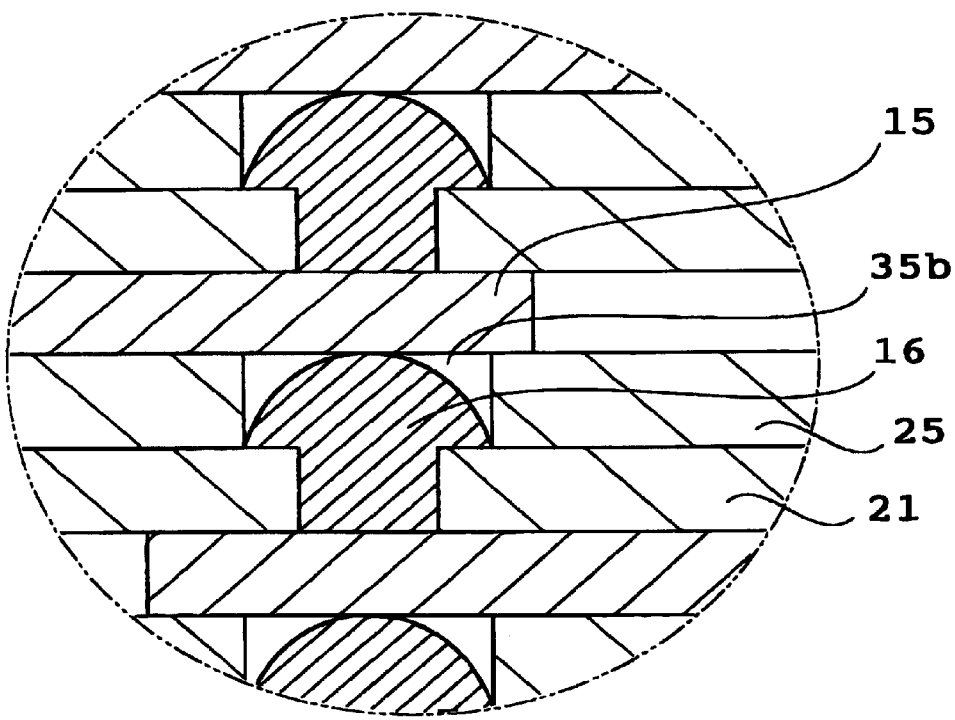
FIG. 3A is an enlarged view of an example of a bump section of a multi-layer substrate of the present invention.

FIG. 3A shows an enlarged view of a connected section of the wiring film 15 and the bumps 16 in the case where a plurality of single layer substrates are laminated on top of one another.

Reference numeral 6a in FIG. 3B is a cross section of a multi-layer substrate having a fourth single layer substrate 4, two second single layer substrates $2_1$ and $2_2$, and three first single layer substrates $1_1$–$1_3$ laminated in that order. Through holes $35a_1$–$35a_3$ of the same size are formed at the same positions in each of the first single layer substrates $1_1$–$1_3$. The second single layer substrate $2_2$ is connected to the lowermost first single layer substrate $1_1$, which means that this second single layer substrate $2_2$ is positioned on the bottom of the housing section 26. Accordingly, the housing section 26 having a bottom is formed by the through holes $35a_1$–$35a_3$ of the first single layer substrates $1_{1-3}$, and the second single layer substrate $2_1$ arranged at the bottom of the through holes.

Reference numeral 16a in FIG. 3B represents bumps, among the bumps 16 provided on the second single layer substrate $2_2$ exposed at the bottom of the housing section 26.

Reference numeral 16b in FIG. 3B represents bumps of the first single layer substrate $1_3$ positioned on the surface of the multi-layer substrate 6a, and reference numeral 16c represents bumps positioned inside the multi-layer substrate 6a and connecting to the wiring film 15.

Figure 3C:
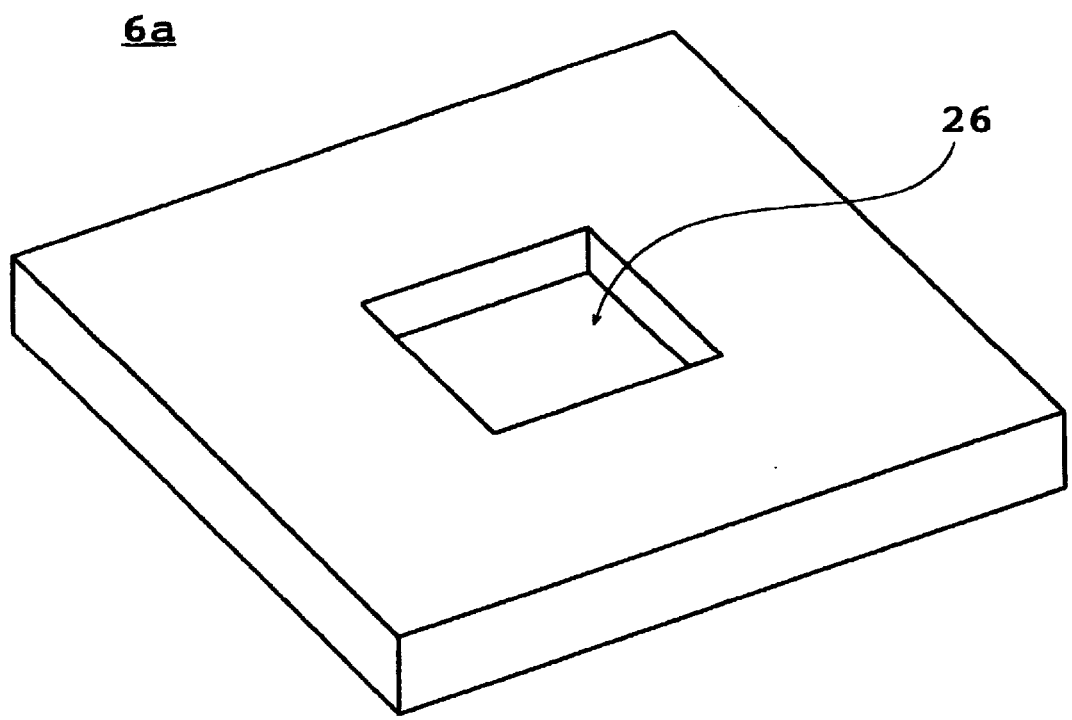
FIG. 3C is a perspective view showing the outline of the housing section.

FIG. 3C is a perspective schematic drawing of a section forming the housing section 26 of the multi-layer substrate 6a. Bumps 16 of the second single layer substrate $2_2$ are exposed at the bottom of the housing section 26, but these are omitted from this perspective drawing.

Next, processing for mounting an electrical element on this multi-layer substrate 6a will be described.

Figure 4A:
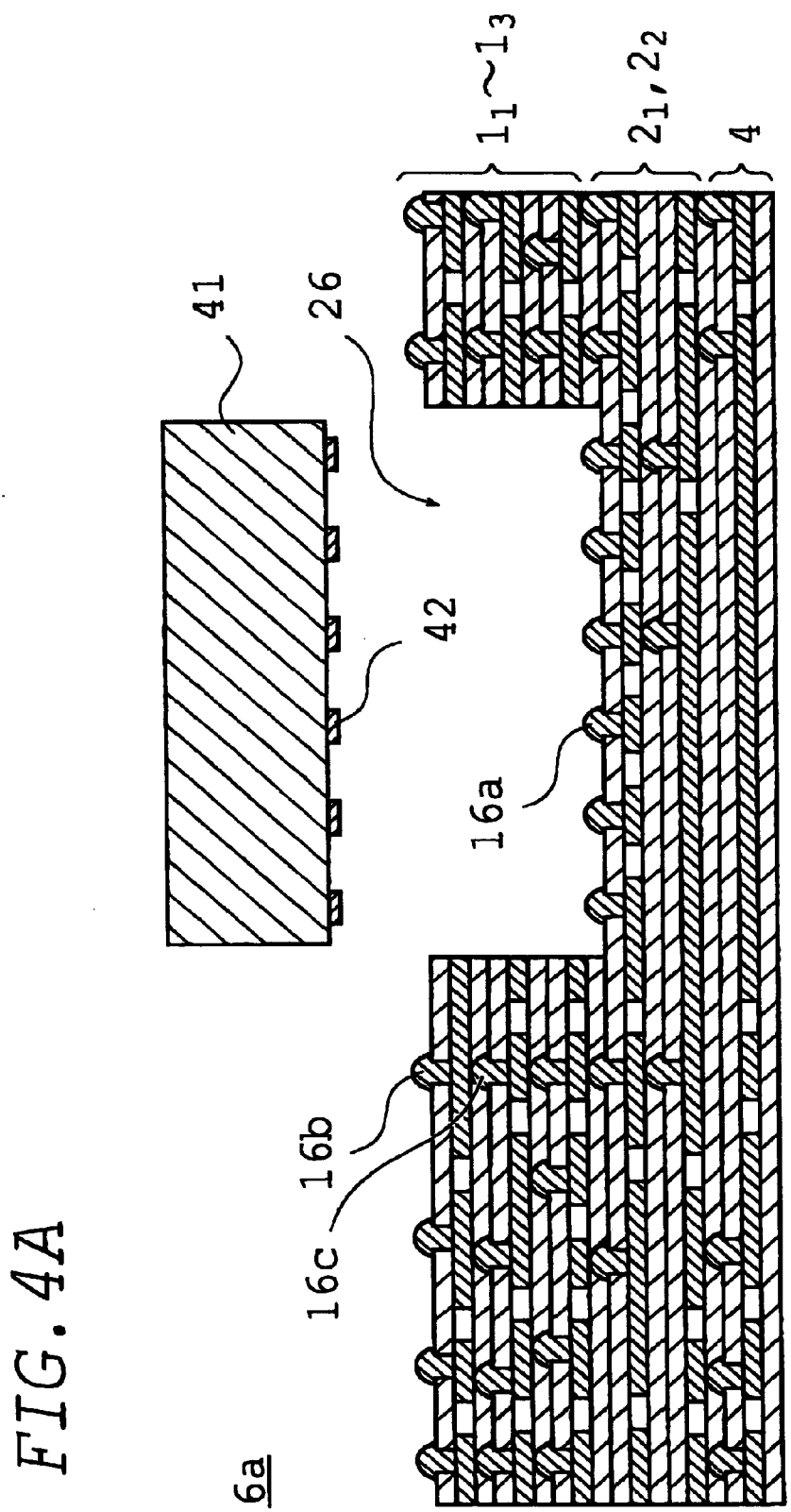

Reference numeral 41 in FIG. 4A represents a semiconductor device such as a semiconductor integrated circuit, and is one example of an electrical element that can be mounted. The semiconductor device is provided with microscopic electrical elements on one surface, and forms an electrical circuit. Bonding pads 42 formed from a metallic thin film are formed on the surface on which this electrical circuit is formed.

In the case where a semiconductor device 41 is mounted on the multi-layer substrate 6a, the semiconductor device is inserted into the housing section 26 with the bonding pads 42 facing towards the bottom of the housing section 26.

The bumps 16a inside the housing section 26 are arranged corresponding to the bonding pads 42, and when they are aligned, the bonding pads 42 are mounted on the bumps 16a.

Figure 4B:
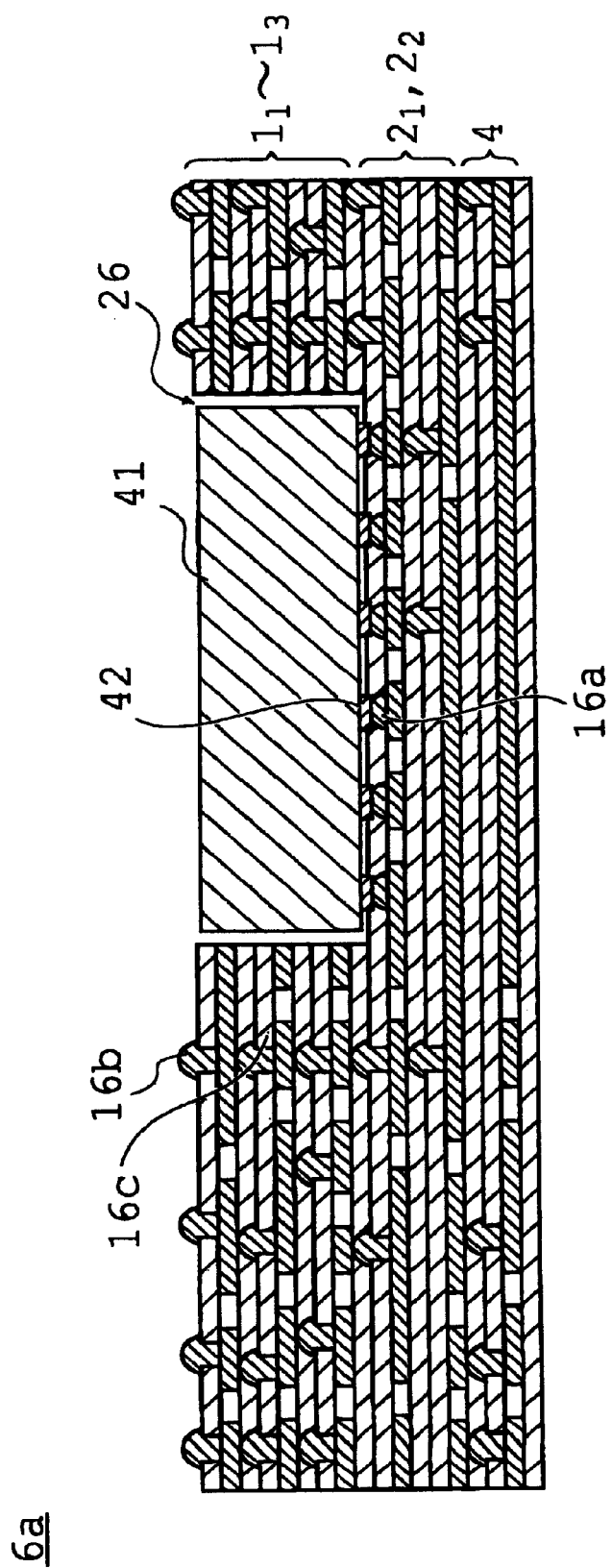

With the bonding pads 42 mounted on the bumps 16a, when the semiconductor device 41 is pressed against the multi-layer substrate 6a while heating, the surf ace of the semiconductor device 41 comes into contact with the surface of the adhesive layer 21 on the bottom of the housing section 26, and the semiconductor device 41 Is adhered to the multi-layer substrate 6a by the softened adhesive layer 21 (FIG. 4B).

Figure 4C:
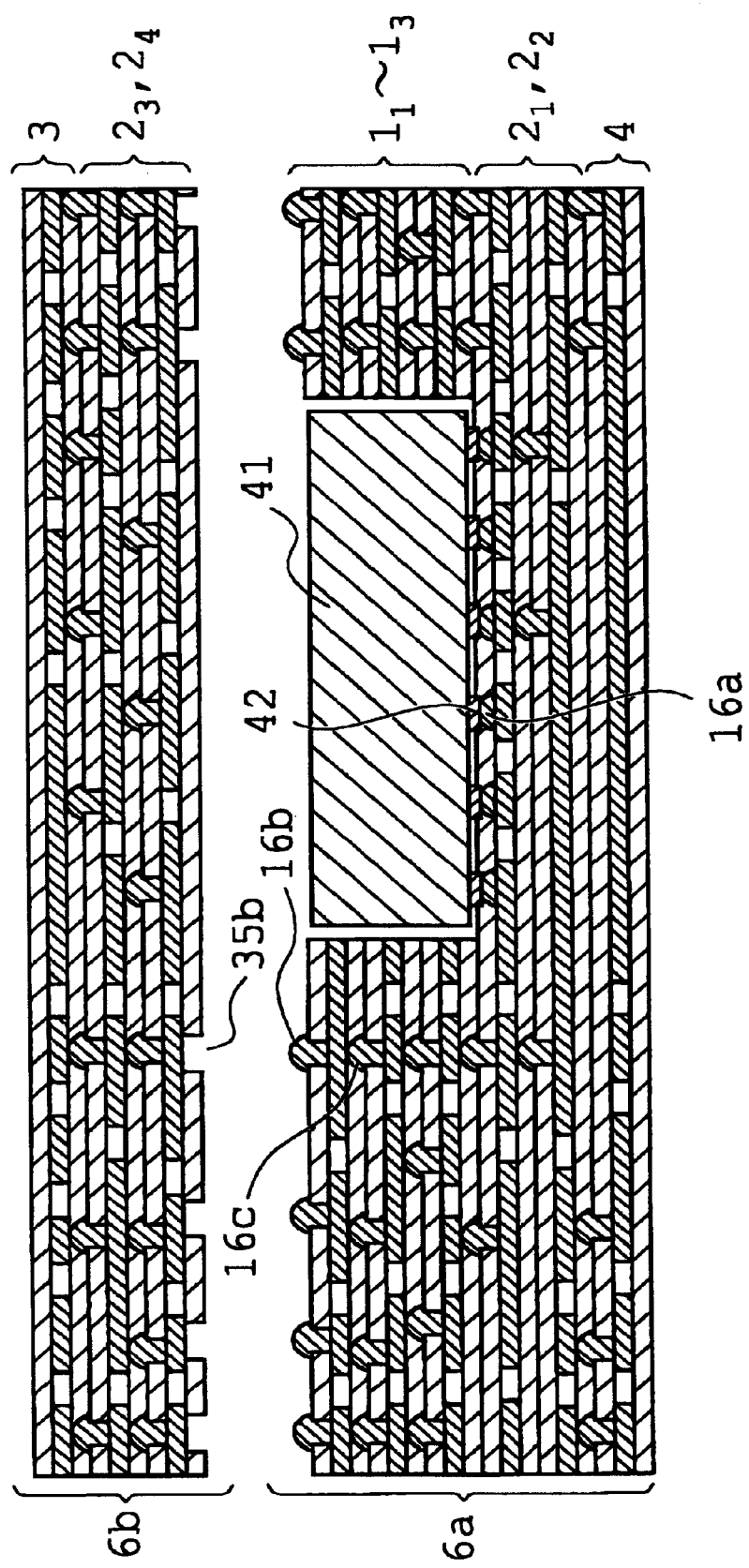

In addition to the multi-layer substrate 6a having the housing section 26 as described above, a multi-layer substrate as shown by reference numeral 6b in FIG. 4C is also prepared.

This multi-layer substrate 6b is comprised of two second single layer substrates $2_3$ and $2_4$ and a third single layer substrate 3 laminated in this order. This multi-layer substrate 6b act as a cover, and the multi-layer substrate 6a forming the housing section 26 acts as a container, and after housing the semiconductor device 41 inside the housing section 26, the cover side multi-layer substrate 6b is placed on the top of the container side multi-layer substrate 6a.

Connection holes 35b of the second single layer substrate $2_3$ are arranged on the bottom of the cover side multi-layer substrate 6b, and these connecting holes 35b and bumps 16b exposed on the container side multi-layer substrate 6a are arranged at positions corresponding to each other.

As a result, when covering is carried out by aligning the cover side multi-layer substrate 6b and the container side multi-layer substrate 6a, the bumps 16b of the container side multi-layer substrate 6a come into contact with the surface of the wiring film 15 exposed on the bottom of the connection holes 35b of the cover side multi-layer substrate 6b.

If heating and pressing are carried out in this state, the container side multi-layer substrate 6a and the cover side multi-layer substrate 6b are adhered by the adhesive layer 21, and the wiring film 15 inside the cover side multi-layer substrate 6b and the wiring film 15 inside the housing 26 side multi-layer substrate 6a are electrically connected using the umps 16b to form an integrated multi-layer substrate 6.

A semiconductor device 41 is housed inside this multi-layer substrate 6, and the housing section 27 is formed utilizing an airtight cavity.

In this way, the semiconductor device 41 is integrated in a housed state. When one multi-layer substrate 6 is formed, a chip-mounted multi-layer substrate 62 is constructed of the multi-layer substrate 6 and the semiconductor device 41 buried inside the airtight housing section 27 (FIG. 4D).

A circuit inside the semiconductor device 41 is respectively connected to wiring films 15 of each of the single layer substrates 1–4 constituting the multi-layer substrate 6 via the bonding pads 42 and the bumps 16.

Figure 5:
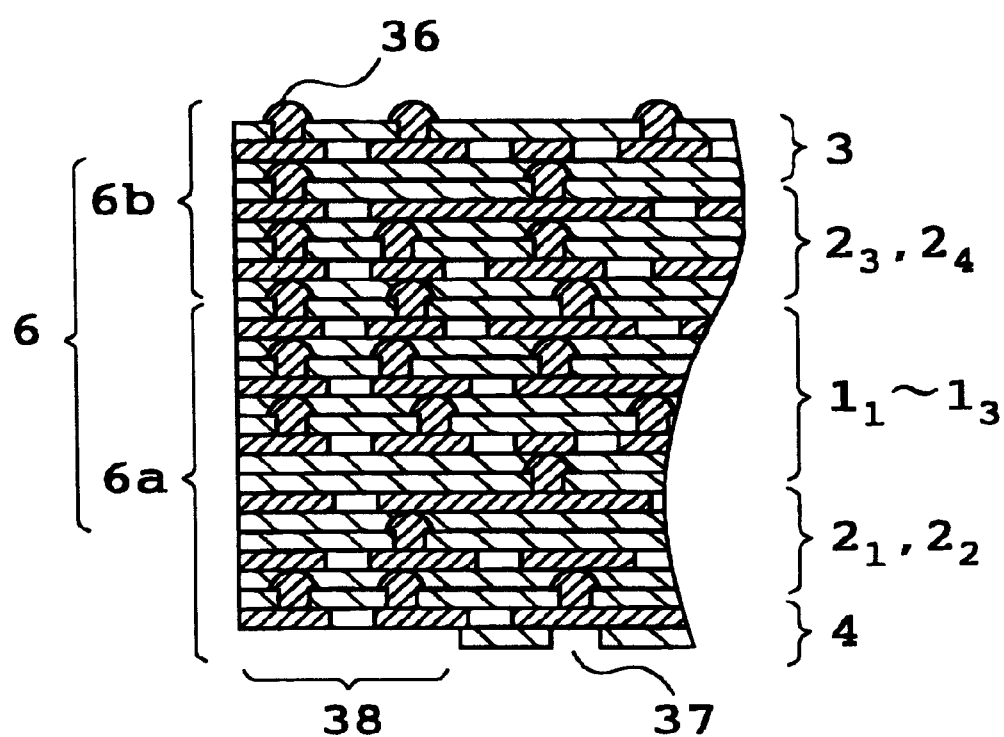
FIG. 5 shows the end of the multi-layer substrate.

An end section of this chip-mounted state multi-layer substrate 62 is constructed so that it is possible to electrically connect wiring films 15 inside the multi-layer substrate 6 to other circuit substrates etc. using bumps 36 exposed on the surface or connecting holes 37 formed on the bottom, as shown in FIG. 5. Accordingly, the semiconductor device 41 inside the multi-layer substrate 62 can be electrically connected to other circuit substrates using the bumps 36 or the connecting holes 37.

Also, a wiring film 15 having a comparatively large surface area is exposed at the bottom surface of an end section to form a connection terminal 38, and it is possible to connect to other electrical substrates using this connection terminal.

In this way, with the above described multi-layer substrate 62, since the semiconductor device 41 is buried inside the multi-layer substrate 6, the overall thickness is not increased by the extent of the semiconductor device 41.

Also, since the first to fourth single layer substrates 1–4 constituting the multi-layer substrate 62 are flexible, this multi-layer substrate 62 is flexible except at parts where the semiconductor device 41 is mounted.

In this embodiment, a multi-layer substrate has been constructed having only one semiconductor device 41 buried inside the multi-layer substrate 6, but it is also possible to construct a multi-layer substrate having a plurality of semi-conductor devices buried inside. In this case, electrical connection among buried semiconductor substrates can be ensured by the wiring film 15 and the bumps 16 inside the multi-layer substrate 6.

Figure 6A:
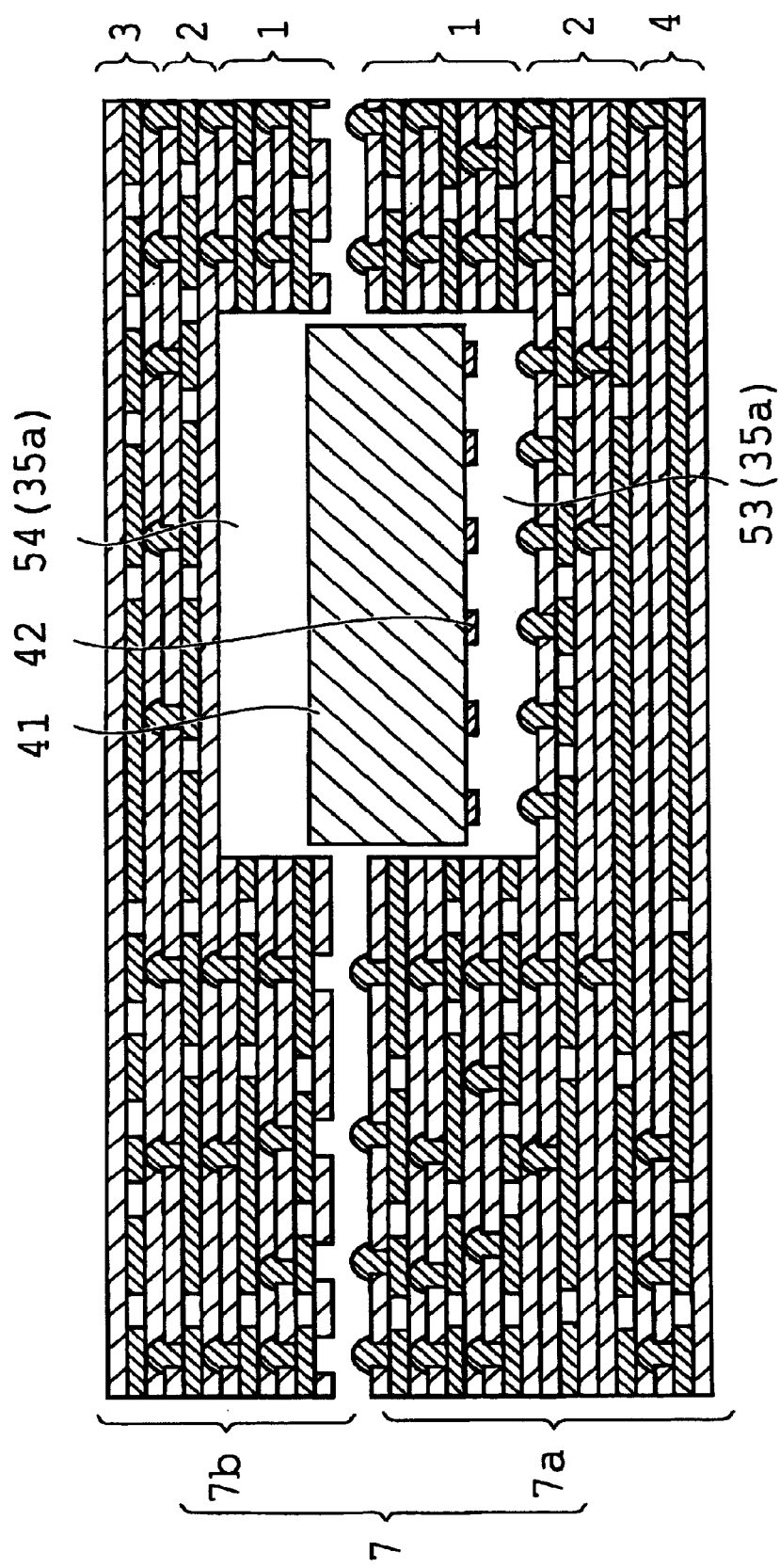
FIGS. 6A–6D show another example of a multi-layer substrate of the present invention.

Next, another embodiment of the present invention will be described. Reference numeral 7a in FIG. 6A represents a multi-layer substrate having the same structure as the above described container side multi-layer substrate 6a. A cover side multi-layer substrate 7b is formed opposite this container side multi-layer substrate 7a by further laminating a second single layer substrate 2 and a third single layer substrate 3 in that order on a plurality of laminated first single layer substrates 1.

A housing section 53 having a bottom is formed on the container side multi-layer substrate 7a using through holes 35a of the laminated first single layer substrates 1, and similarly, a housing section 54 having a bottom is formed on the cover side multi-layer substrate 7b using through holes 35a.

The above described semiconductor device 41 is housed inside the housing section 53 of the container side multi-layer substrate 7a and adhered to this multi-layer substrate 7a. Also, when an integrated multi-layer substrate 7 is formed by electrically connecting to the wiring film 15 and further adhering the cover side multi-layer substrate 7b onto the multi-layer substrate 7a and electrically and mechanically connecting between the multi-layer substrates 7a and 7b, the semiconductor device 41 is housed inside a cavity formed by the two housing sections 53 and 54.

This multi-layer substrate 7 has the same structure as the multi-layer substrate 6 shown in FIG. 4D, and similarly can mount electrical elements.

Figure 6B:
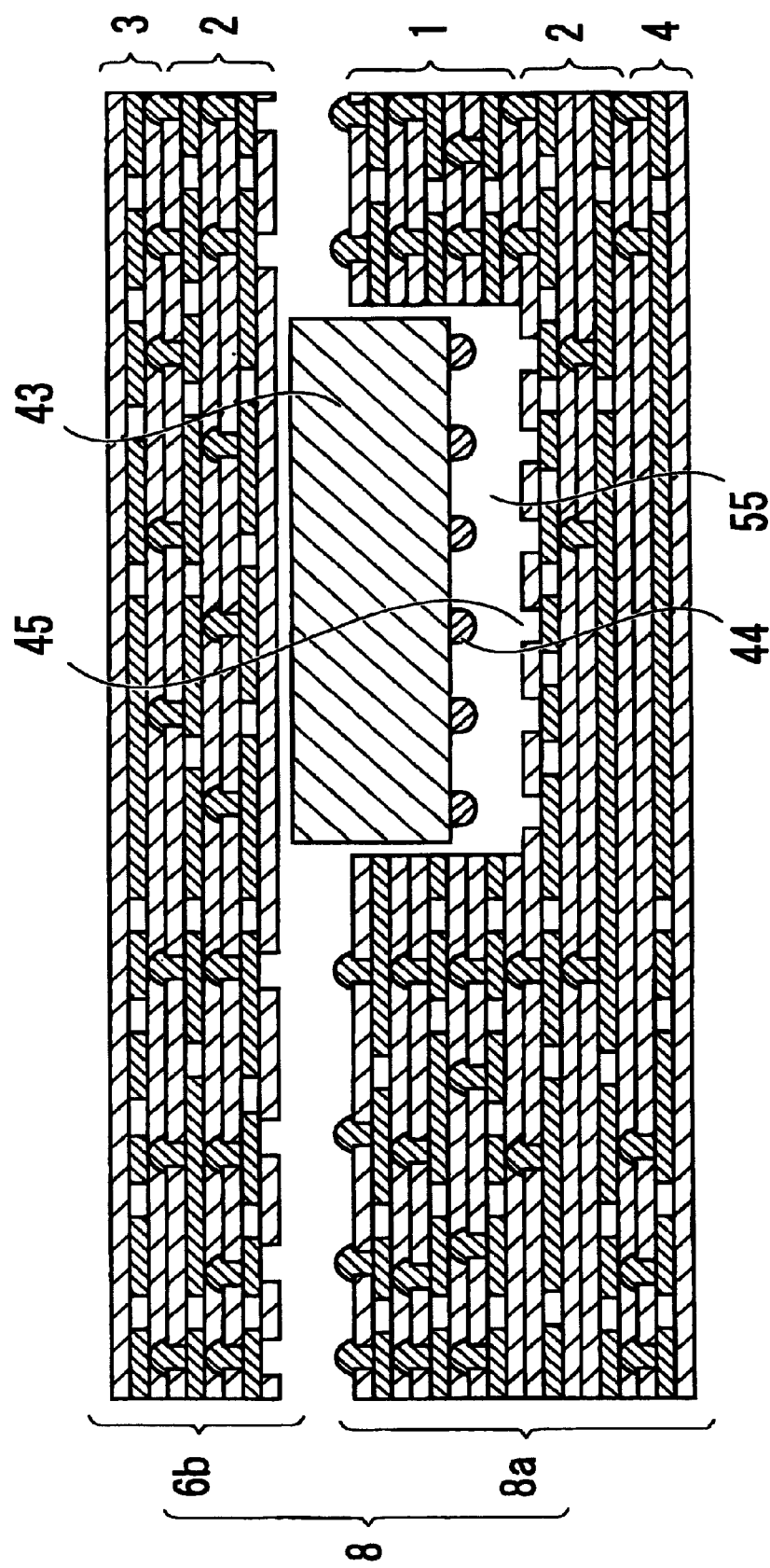

Next, reference numeral 43 in FIG. 6B represents a semiconductor device having bumps 44 formed on the surface. When this semiconductor device 43 is used, it is preferable to partially expose the surface of the wiring film 15 at the bottom of the housing section 55 of a container side multi-layer substrate 8a so as to come into contact with the bumps 44 formed on the semiconductor device 43.

An integrated multi-layer substrate 8 is obtained by bonding together this multi-layer substrate 8a and cover side multi-layer substrates 6b and 7b shown in FIG. 4C and FIG. 6A. A chip-mounted multi-layer substrate of the present invention is obtained using this multi-layer substrate 8 and the semiconductor device 43 embedded inside the multi-layer substrate 8.

Figure 6C:
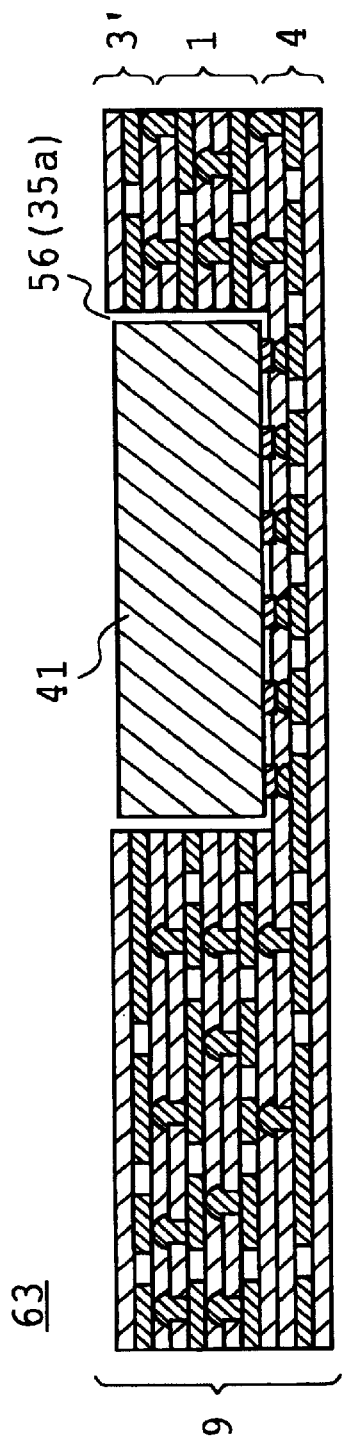

Reference numeral 9 in FIG. 6C represents a multi-layer substrate having a third single layer substrate 3' provided with through holes.

This multi-layer substrate 9 is formed by laminating a fourth single layer substrate 4, a plurality of first single layer substrates 1 and the third single layer substrate 3' in that order. A resin film constituting a protective film is formed on the surface of the third single layer substrate 3'.

Through holes of the third single layer substrate 3' are arranged at the same positions as the through holes 35a of the first single layer substrates 1, and semiconductor device 41 is contained inside a housing section 56 formed by these through holes in an electrically and mechanically connected state.

A rear surface of the semiconductor device 41 is exposed on a surface of the multi-layer substrate 9. Also, the rear surface of the semiconductor device 41 and the surface of the multi-layer substrate 9 have approximately same hight, and substantially flush. With the chip-mounted multi-layer substrate 63 comprising this multi-layer substrate 9 and the semiconductor device 41, the rear surface of the semiconductor device 41 is exposed, which means that heat dissipation is excellent.

Figure 6D:
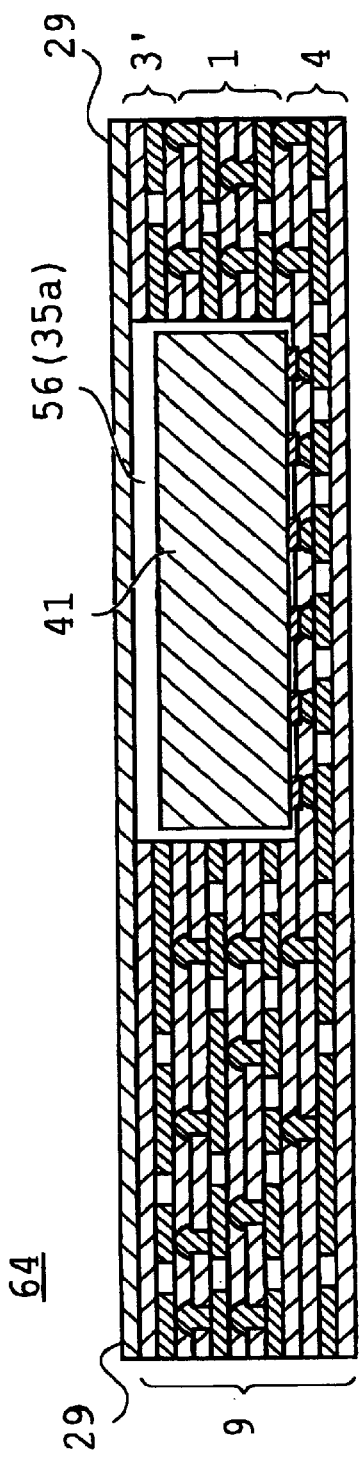

Reference numeral 64 in FIG. 6D represents a multi-layer substrate having a protective film 29 bonded on the above described multi-layer substrate 63. This multi-layer substrate 64 has its surf ace covered by the protective film 29, which means that moisture resistance etc. is excellent.

Figure 7:
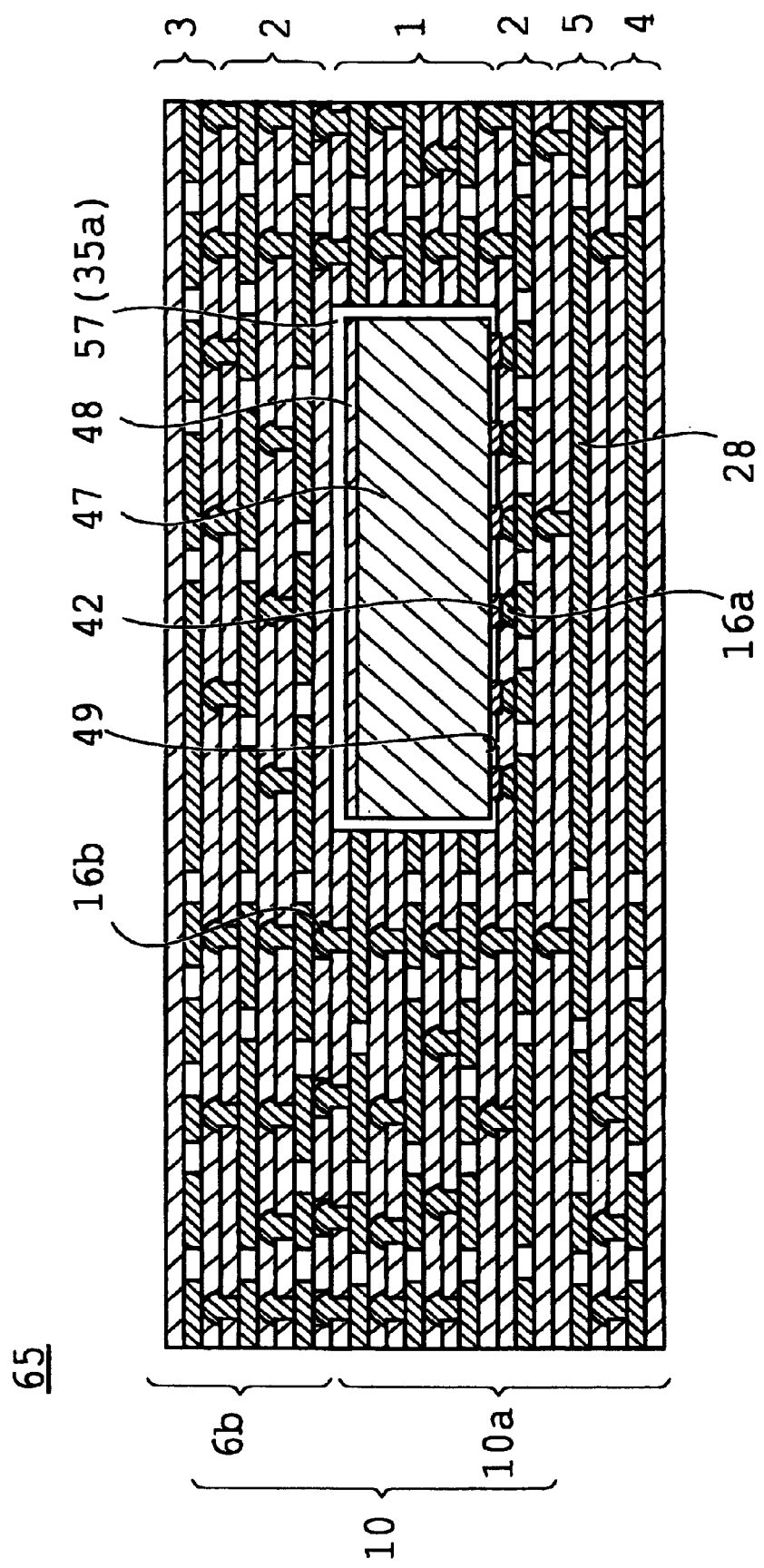
FIG. 7 shows an example of a multi-layer substrate of the present Invention having a shield section.

Next, the multi-layer substrate 65 shown in FIG. 7 has a container side multi-layer substrate 10a formed of a fourth single layer substrate 4, a plurality of second single layer substrates 5, 2 laminated on the fourth single layer substrate 4, a plurality of first single layer substrates 1 further laminated on the second single layer substrates, and a third single layer substrate constituting an uppermost layer.

Figure 8:
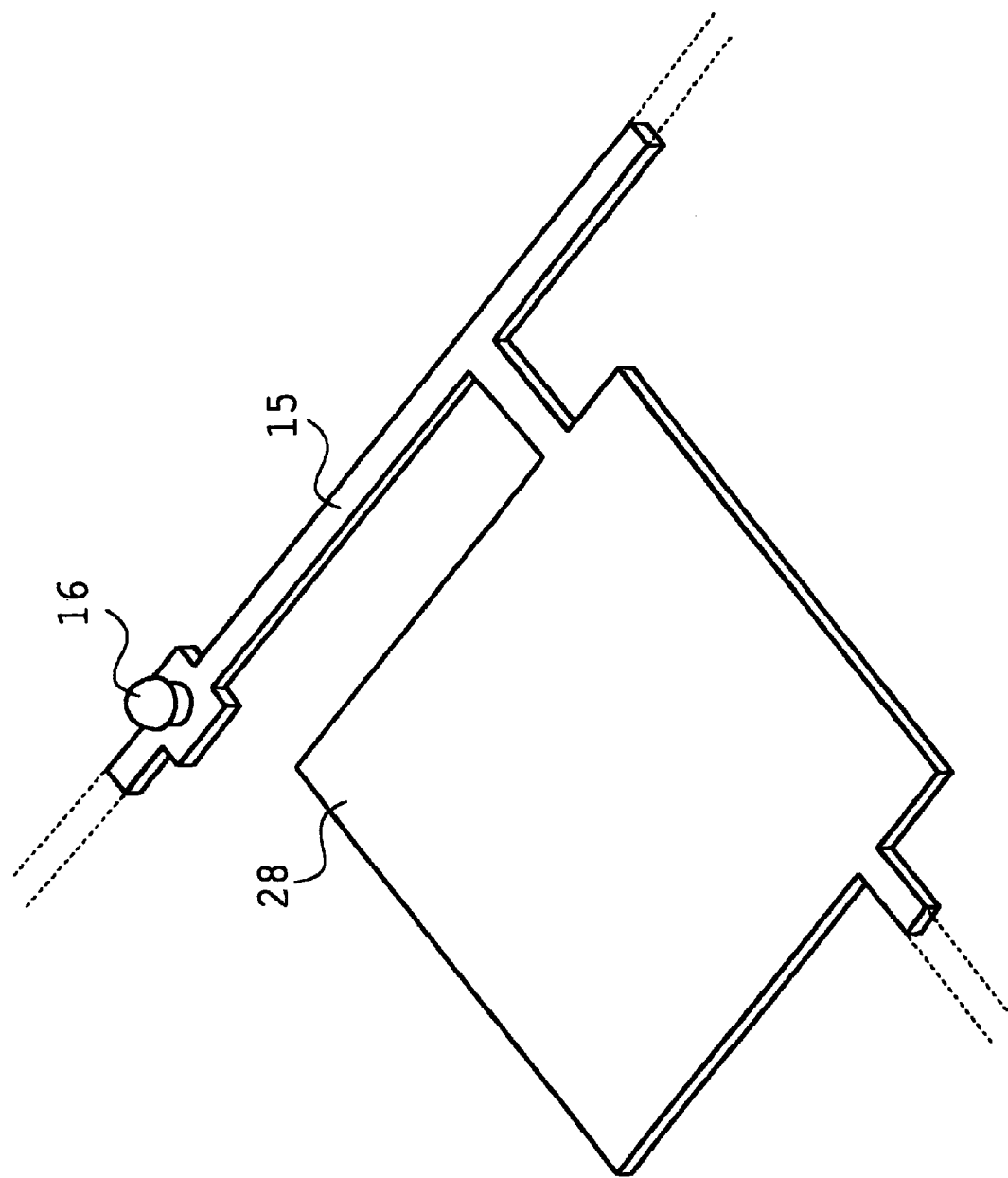
FIG. 8 shows the shield section.
Figure 9A:
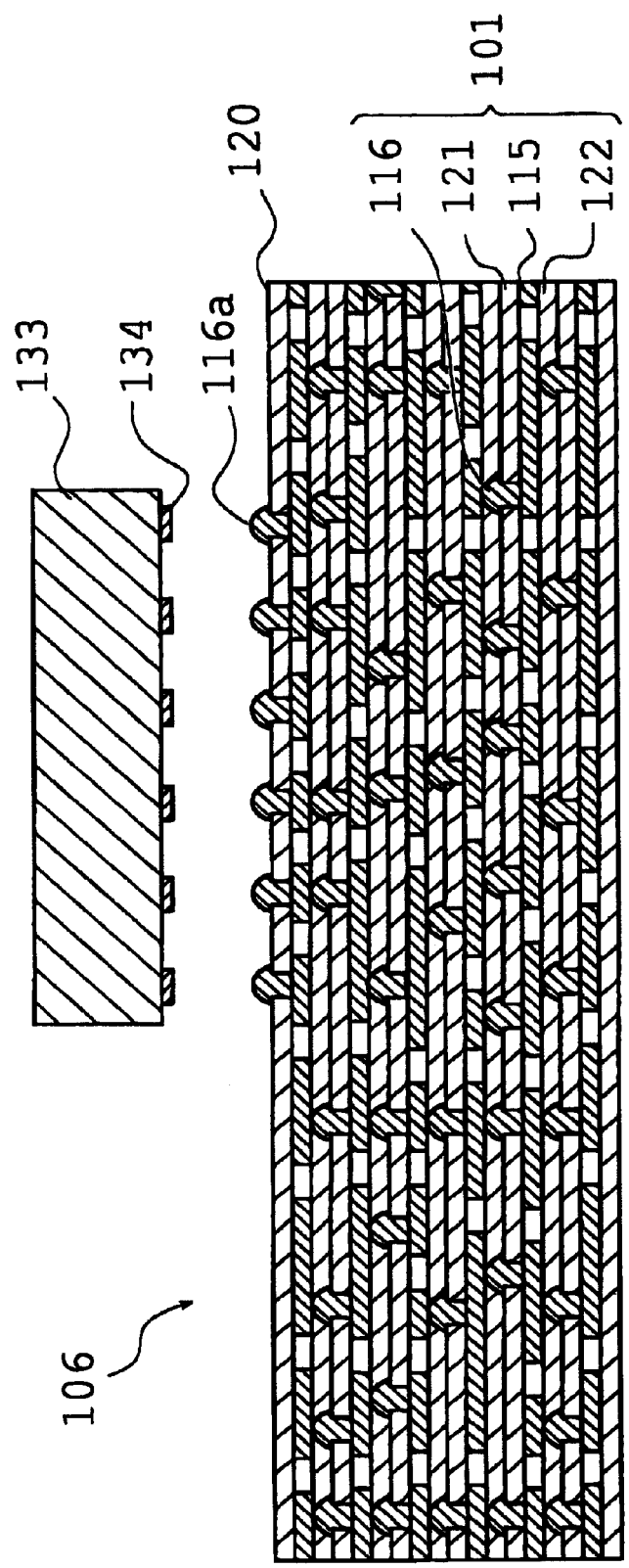
FIGS. 9A–9C show a manufacturing process for a multi-layer substrate of the related art.
Figure 9B:
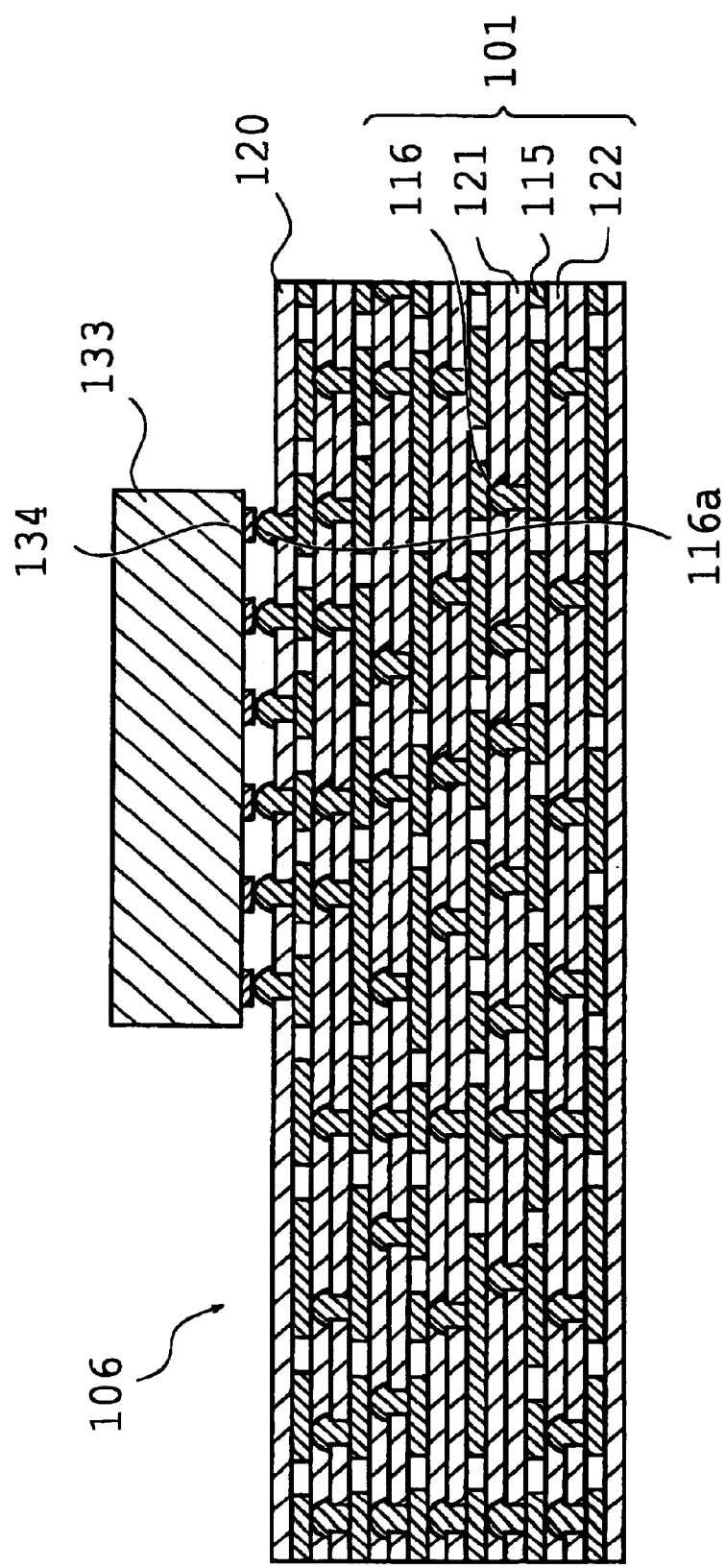
Figure 9C:
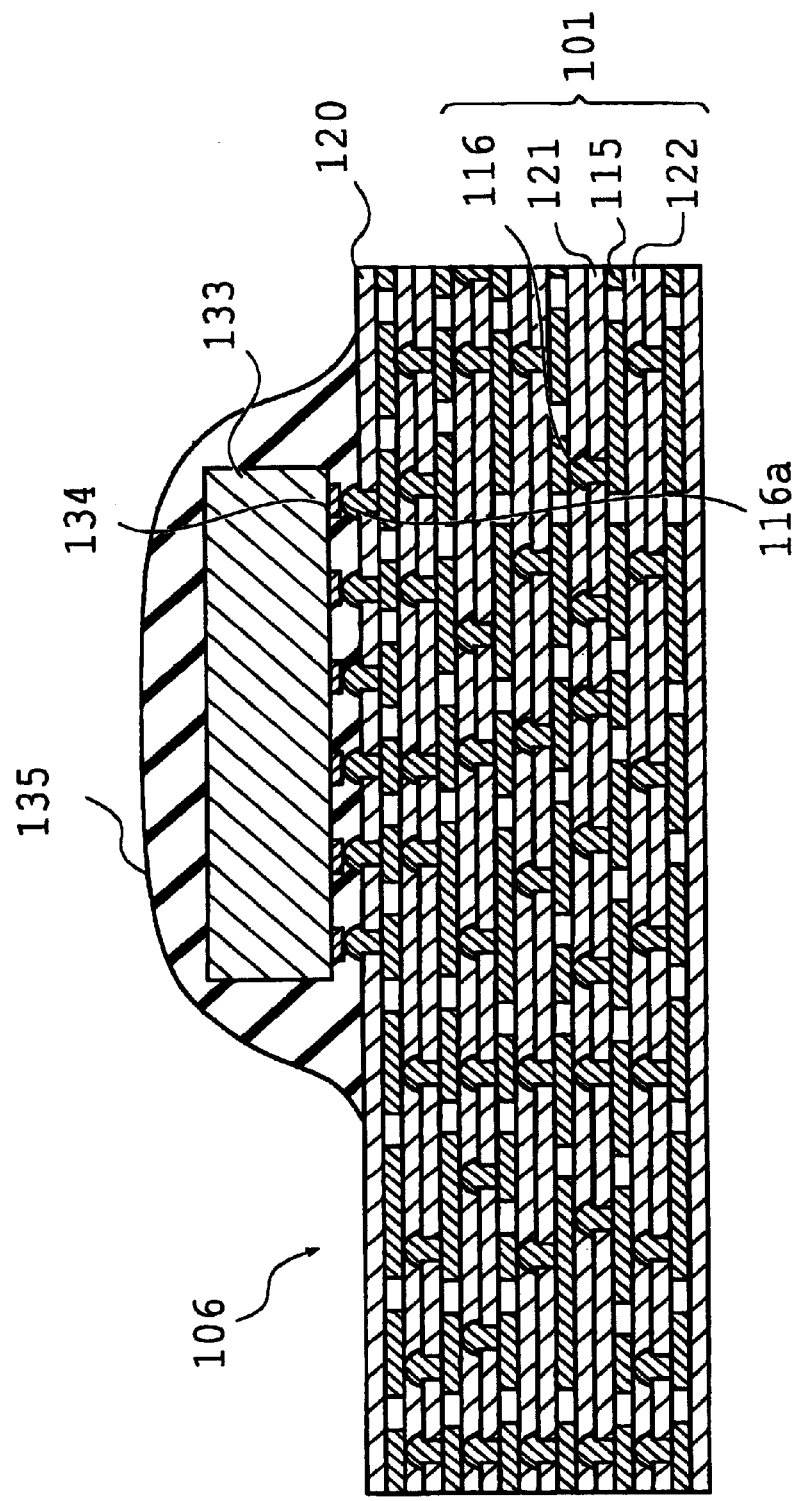

A second single layer substrate 5 adjacent to a second single layer substrate 2 on which a semiconductor device 47 is mounted has a shield section 28 formed from a wiring film 15 having a comparatively large surface area, as shown in FIG. 8. Here, the second single layer substrate 5 having the shield section 28 is connected to the fourth single layer substrate 4.

This multi-layer substrate 65 is formed of the multi-layer substrate 10a constituting a container and the multi-layer substrate 6b constituting a cover. The container side multi-layer substrate 10a has laminated first single layer substrates 1, and a housing section 57 is formed by the through holes 35a in each of the first single layer substrates. The cover side multi-layer substrate 6b is then placed on the housing section 57 with the semiconductor device 47 being contained inside the housing section 57, and the housing section 57 is made airtight. This semiconductor device 47 is a chip-mounted semiconductor integrated circuit.

The shield section 28 is formed at the same time as the wiring film 15 when a narrow wiring film 15 is formed by patterning a metallic foil 11, and has either substantially the same surface area as the bottom of the housing section 57 or a larger surface area than the bottom of the housing section 57. Accordingly, the shield section 28 has a larger surface area than the semiconductor device 47. This shield section 28 is arranged parallel to the bottom, so as to cover the bottom of the housing section 57.

The semiconductor device 47 is housed inside the housing section 57. A circuit made up of microscopic electrical elements are formed on a surface 49 of the semiconductor device 47. Bonding pads 42 are provided on the surface 49 using a metallic wiring film for connecting among the microscopic electrical elements, and mechanically connected to the second single layer substrate 2 of the container side multi-layer substrate 10a using an adhesive film positioned on the bottom of the housing section 57. Also, Electrical circuits in side the semiconductor device 47 and the wiring film 15 are electrically connected using bumps 16a of the second single layer substrate 2 contacting the bonding pads 42. In this state the cover side multi-layer substrate 6b is electrically and mechanically connected to the container side multi-layer substrate 10a.

Accordingly, with the semiconductor device 47 buried inside the housing section 57, the circuit formation surf ace 49 of the semiconductor device 47 faces the shield section 28 and is covered by the shield section 28.

Generally, with a semiconductor integrated circuit, a metallic film 48 is formed on a rear surface side opposite to a surface where the bonding pads 42 are formed, and this metallic film 48 is connected to a ground potential.

Accordingly, when the wiring film 15 connected to the shield section 28 is connected to the ground potential, electromagnetic noise that would normally infiltrate into the semiconductor device 47 from outside the multi-layer substrate 65 is absorbed by the shield section 28 and the rear surface side metallic film 48 and therefore does not penetrate into the semiconductor device 47.

Although in FIG. 7, the shield section 28 is arranged on the circuit formation surface 49 side of the semiconductor device 47, it is more effective to arrange the shield sections 1 28 on both side of the semiconductor device 47.

In this way, the multi-layer substrate 65 of FIG. 7 is comprised of the multi-layer substrate 10 having the shield section 28 and the semiconductor device 47 buried inside the multi-layer substrate 10, which has strong noise resistance.

In the above description, a solder coating is provided on the bump surfaces, and the bumps and the wiring films connected by melting the solder, but it is also possible to electrically connect by bringing the bumps and the wiring films into contact with each other. In this case, it is possible to form a gold coating on the bumps instead of a solder coating.

When a gold coating is provided, it is possible to apply ultrasonic waves to make the bumps and the wiring film adhered, and to electrically and mechanically connect the bumps and the wiring films.

Also, the above description has centered around an example where an example of the circuit element is a semiconductor integrated circuit, but the present invention is not thus limited to an integrated circuit and can also apply to discrete transistor components or diode elements. Also, in the present invention, electrical element that can be housed in the housing section are not limited to a semiconductor device, and can include electrical elements other than semiconductor devices such as capacitors, inductive elements, and resistive elements. The semiconductor device is not limited to a chip-mounted device, and it is also possible to house a component that can be housed in a resin or ceramics package in the housing section.

In the case of housing a chip-mounted semiconductor element in the housing section, metallic wiring films or bumps of the semiconductor element, and bumps or bonding lands on the bottom of the housing section are preferable connected.

Electrical elements that can be received inside a package preferable have leads drawn out from the package connected to bumps or bonding lands on the bottom of the housing section.

According to the present invention, the thickness of a multi-layer substrate is not increased, even if a semiconductor device is mounted, and because of the shield section, noise does not penetrate inside the device.

What is claimed is:

1. A multi-layer substrate with a housing section formed therein, the multi-layer substrate comprising
    a plurality of first single layer substrates having a first resin film,
    a first wiring film arranged on said first resin film,
    through holes passing through from a front surface of said first layer substrate to a rear surface,
    a second resin film and a second wiring film arranged on said second resin film,
    a second single layer substrate not having through holes being laminated at least at position where said housing section is formed, and
    said second single layer substrate being located on bottoms of said housing section,
    wherein at least two of said first single layer substrates are electrically connected together by said first wiring film, and said through holes are arranged so as to be aligned.

2. The multi-layer substrate of claim 1, wherein an opening area of said housing sections is 1 mm$^2$ or more.

3. The multi-layer substrate of claim 1, wherein at least part of said second wiring film of said second single layer substrate and said first wiring film of said first single layer substrate adjacent to said second single layer substrate are electrically connected together.

4. The multi-layer substrate of claim 1, wherein an electrical element is arranged inside said housing section, and at least part of said first wiring film is electrically connected to said electrical element.

5. The multi-layer substrate of claim 1, wherein
    said first single layer substrates comprise first bumps connected to said first wiring film, and first connection holes, formed in said first resin film, said first wiring film being located on a bottom surface of said first connection holes,
    two adjacent first single layer substrates are connected through said first bumps of one of said first single layer substrates, and positions of said first wiring film at bottoms of said first connection holes of the other first single layer substrate.

6. The multi-layer substrate of claim 5, further comprising a second resin film and a second wiring film arranged on said second resin film, a second single layer substrate not having through holes being laminated at least at positions where said housing section is formed, and said second single layer substrate being located on a bottom surface of said housing section.

7. The multi-layer substrate of claim 6, wherein said second single layer substrate has second bumps connected to said second wiring film, and said second bumps are connected to said first wiring film located in bottom sections of said first connection holes of said first single layer substrate adjacent to said second single layer substrate.

8. The multi-layer substrate of claim 7, wherein said second bumps are arranged on said bottom surface of said housing section.

9. The multi-layer substrate of claim 6, wherein said second single layer substrate has second connection holes, formed on said second resin film, said second wiring film being located on a bottom surface of said second connection holes, and first bumps of said first single layer substrate adjacent to said second single layer substrate are connected to positions of said second wiring film at the bottoms of said second connection holes.

10. The multi-layer substrate of claim 5, wherein said first single layer substrates has a first adhesive layer, arranged on said first wiring film, exhibiting adhesiveness upon application of heat, and tips of said first bumps project from a surface of said first adhesive film, first single layer substrates being stuck together by adhesive force of said first adhesive layer.

11. A multi-layer substrate of claim 10, further comprising a second resin film and a second wiring film arranged on said second resin film, a second single layer substrate not having through holes being laminated at least at positions where said housing section is formed, and said second single layer substrate being located on a bottom surface of said housing section, wherein
    said second single layer substrate comprises second bumps connected to said second wiring film, and a second adhesive layer arranged on said second wiring film and exhibiting adhesiveness upon application of heat, tips of said second bumps projecting from the surface of said second adhesive layer,
    said second bumps being connected to said first wiring film positioned in bottom sections of said first connection holes of said first single layer substrate adjacent to said second single layer substrate, and
    said first single layer substrate and said second single layer substrate are stuck together using adhesive force of said second adhesive layer.

12. The multi-layer substrate of claim 11, wherein said second bumps are arranged on a bottom surface of said housing section.

13. The multi-layer substrate of claim 12, wherein an electrical element is arranged inside said housing section, and said second bumps of the bottom surface of said housing section are electrically connected to said electrical element.

14. The multi-layer substrate of claim 12, wherein a semiconductor in chip form is arranged inside said housing section, and a metallic wiring film of said semiconductor device is connected to said second bumps of the bottom surface of said housing section.

15. The multi-layer substrate of claim 14, wherein said housing section is covered by a covering single layer substrate having at least a resin film.

16. The multi-layer substrate of claim 15, wherein a wiring film is provided on said resin film of said covering single layer substrate.

17. The multi-layer substrate of claim 15, wherein the second wiring film comprises a portion, as a shield, that has a larger surface area than said semiconductor device at positions where said housing section is likely to be elongated in a laminating direction of said single layer substrate.

18. A multi-layer substrate of claim 10, further comprising a second resin film and a second wiring film arranged on said second resin film, a second single layer substrate not having through holes being laminated at least at positions where said housing section is formed, and said second single layer substrate being located on a bottom surface of said housing section, wherein
said second single layer substrate is formed on said second resin film, and has second connection holes, said second wiring film being located on bottoms of said second connection holes,
said first bumps of said first single layer substrate adjacent to said second single layer substrate are connected to positions of said second wiring film at the bottoms of said second connection holes, and
said first single layer substrate and said second single layer substrate are stuck together by the adhesive force of said first adhesive layer.

19. The multi-layer substrate of claim 11, wherein bonding pads are formed on said second adhesive layer of said second single layer substrate using openings, said bonding pads are arranged on a bottom surface of said housing section.

20. The multi-layer substrate of claim 19, wherein an electrical element is arranged inside said housing section, and said bonding pads of the bottom surface of said housing section are electrically connected to bumps on the bottom of said electrical element.

21. The multi-layer substrate of claim 19, wherein a semiconductor in chip form is arranged inside said housing section, and bumps of said semiconductor device are connected to said bonding pads of the bottom surface of said housing section.

22. The multi-layer substrate of claim 21, wherein said housing section is covered by a covering single layer substrate having at least a resin film.

23. The multi-layer substrate of claim 22, wherein a wiring film is provided on said resin film of said covering single layer substrate.

24. The multi-layer substrate of claim 22, wherein the second wiring film comprises a portion, as a shield, that has a larger surface area than said multi-layer semiconductor device at positions where said housing section is likely to be elongated in a laminating direction of said single layer substrate.

* * * * *